United States Patent
Nakagawa et al.

[11] Patent Number: 6,064,086
[45] Date of Patent: *May 16, 2000

[54] SEMICONDUCTOR DEVICE HAVING LATERAL IGBT

[75] Inventors: Akio Nakagawa, Yokohama; Tomoko Matsudai; Hideyuki Funaki, both of Tokyo; Norio Yasuhara, Kawasaki, all of Japan

[73] Assignee: Kabushiki Kaisha Toshiba, Kawasaki, Japan

[*] Notice: This patent is subject to a terminal disclaimer.

[21] Appl. No.: 09/072,460

[22] Filed: May 5, 1998

Related U.S. Application Data

[63] Continuation-in-part of application No. 08/970,103, Nov. 13, 1997, Pat. No. 5,920,087, which is a continuation of application No. 08/701,500, Aug. 22, 1996, Pat. No. 5,731,603.

[30] Foreign Application Priority Data

Aug. 24, 1995 [JP] Japan ..................................... 7-216350
Mar. 16, 1998 [JP] Japan ..................................... 10-065759

[51] Int. Cl.[7] .......................... H01L 29/76; H01L 29/94; H01L 31/062; H01L 31/113; H01L 31/119
[52] U.S. Cl. .......................... 257/335; 257/336; 257/343; 257/401
[58] Field of Search .................................... 257/335, 336, 257/343, 401

[56] References Cited

U.S. PATENT DOCUMENTS

| | | |
|---|---|---|
| 4,823,172 | 4/1989 | Mihara . |
| 5,089,864 | 2/1992 | Sakurai . |
| 5,731,603 | 3/1998 | Nakagawa et al. ..................... 257/141 |
| 5,920,087 | 7/1999 | Nakagawa et al. ..................... 257/140 |

*Primary Examiner*—Ngân V. Ngô
*Attorney, Agent, or Firm*—Oblon, Spivak, McClelland, Maier & Neustadt, P.C.

[57] ABSTRACT

An n-type buffer layer and a p-type base layer are formed in the surface of the $n^-$-type drift layer. A $p^+$-type drain layer is formed in the surface of the n-type buffer layer. An $n^+$-type source layer and a $p^+$-type contact layer are formed in the surface of the p-type base layer. A main gate electrode is arranged to face, through a gate oxide film, a surface of the p-type base layer which is interposed between the $n^+$-type source layer and the $n^-$-type drift layer. An n-type relay layer is formed in the surface of the $n^-$-type drift layer to face the $n^+$-type source layer through the p-type base layer under the main gate electrode. The n-type relay layer extends from the $n^-$-type drift layer into the p-type base layer. The n-type relay layer decreases the channel resistance.

22 Claims, 28 Drawing Sheets

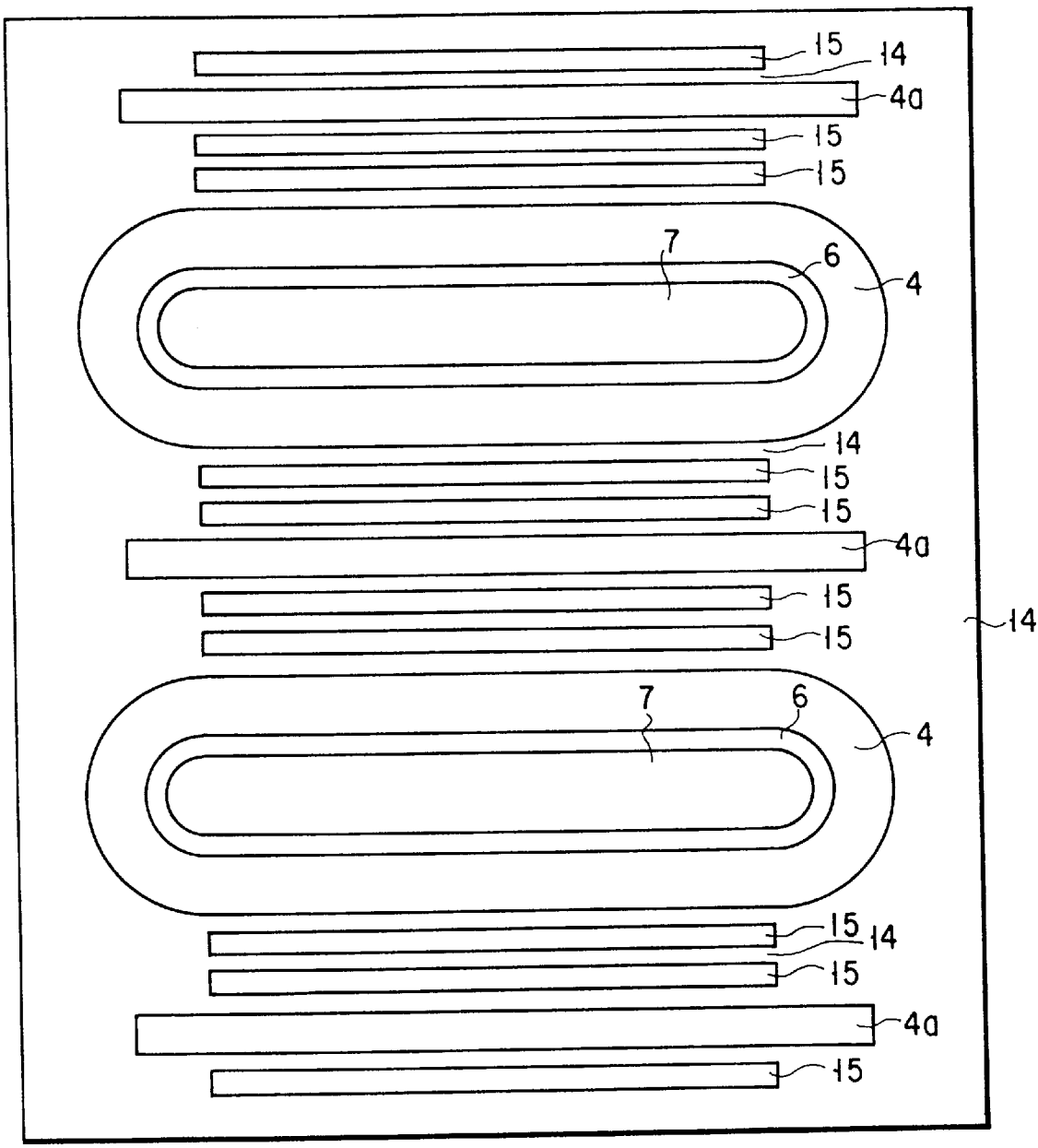
F I G. 17

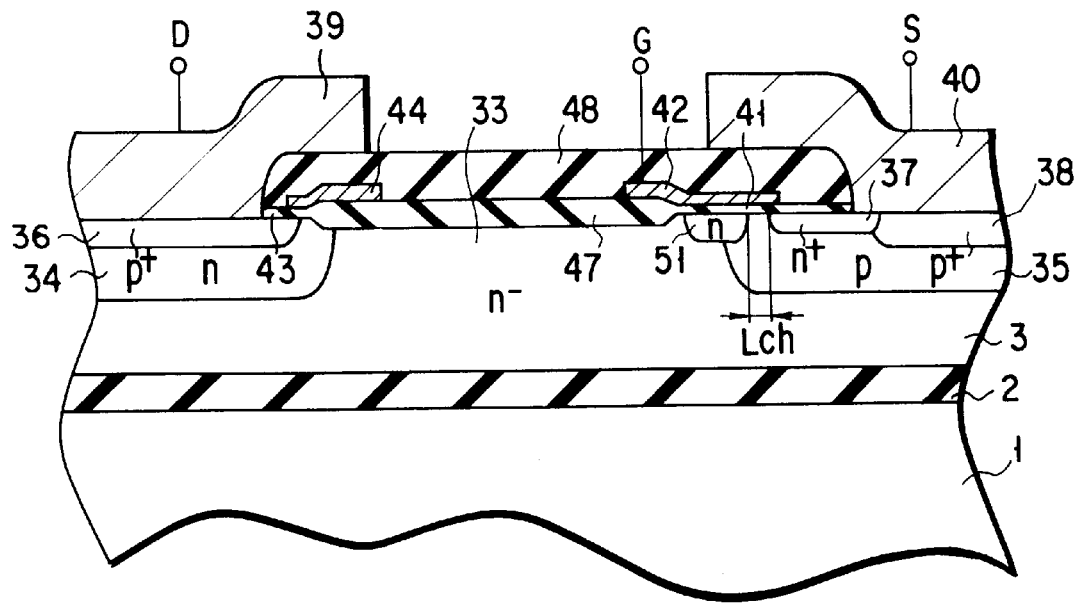
F I G. 22
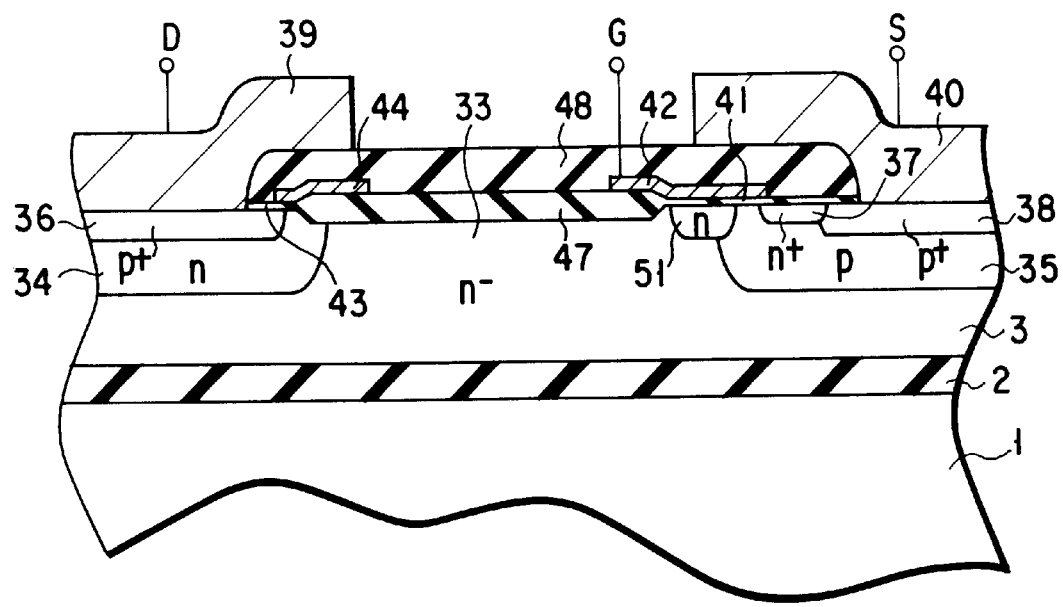
F I G. 23

SEMICONDUCTOR DEVICE HAVING LATERAL IGBT

CROSS-REFERENCE TO RELATED APPLICATIONS

This application is a continuation-in-part of U.S. patent application Ser. No. 08/970,103 filed Nov. 13, 1997, now U.S. Pat. No. 5,920,087 which in turn is a continuation of U.S. patent application Ser. No. 08/701,500 filed Aug. 22, 1996, now U.S. Pat. No. 5,731,603.

BACKGROUND OF THE INVENTION

The present invention relates to a semiconductor device having a lateral IGBT (Insulated Gate Bipolar Transistor), and more particularly to a semiconductor device having a lateral IGBT employing an SOI (Semiconductor On Insulator) substrate.

An IGBT is one of power semiconductor devices of the insulated gate type. The IGBT is a new power semiconductor device having both a high speed switching property of a power MOSFET and a high output property of a bipolar transistor. For this reason, in recent years, IGBTs are frequently used in the field of power electronics, such as an inverter, a switching power supply, or the like. Among the IGBTs, a lateral IGBT draws attention, since it is suitable for a high degree of integration level. In general, the lateral IGBT is formed, using an SOI substrate.

Where a large current is treated in power devices, such as an IGBT, the current capacity of a power output stage is important. A power stage having a current capacity of 1A has been developed as a power stage of 500V class. However, in order to treat a large current, a surface area of the power stage has to be formed larger in proportion to an increase of the necessary current capacity. For example, where 5A is treated, the surface area of the power stage becomes five times larger, thereby making a chip bulky. Therefore, it is necessary to increase a current density per unit area and to keep a chip size compact so as to avoid the above described problem.

However, there is a problem in IGBTs, especially in a lateral IGBT, such that electron injection is not sufficient and thus its current density is hardly increased.

As described above, since an IGBT, which is one of the power devices, has both a high speed switching property and a high output property, it is employed in the field of power electronics. However, on the other hand, the IGBT has a problem such that its current density is hardly increased.

BRIEF SUMMARY OF THE INVENTION

An object of the present invention is to provide a semiconductor device having a lateral IGBT which has a large current density.

According to a first aspect of the present invention, there is provided a semiconductor device having a lateral IGBT, the IGBT comprising:

a drift layer of a first conductivity type formed by using a semiconductor active layer of a high resistivity;

a drain layer of a second conductivity type formed in a common surface of the drift layer;

a base layer of the second conductivity type formed in the common surface of the drift layer;

a source layer of the first conductivity type formed in a surface of the base layer;

a drain electrode arranged in contact with the drain layer;

a source electrode arranged in contact with the source and base layers; and a main gate electrode facing, through a gate insulating film, a surface of the base layer which is interposed between the source layer and the drift layer, and is located on a side facing the drain layer, wherein a relay layer of the first conductivity type having a resistivity lower than that of the drift layer is formed in the common surface of the drift layer to have a facing portion which faces the source layer through the base layer under the main gate electrode, and the relay layer has a surface concentration of an impurity of the first conductivity type which falls within a range of from $2 \times 10^{16}$ cm$^{-3}$ to $2 \times 10^{17}$ cm$^{-3}$.

According to a second aspect of the present invention, there is provided a semiconductor device having a lateral IGBT, the IGBT comprising:

a drift layer of a first conductivity type formed by using a semiconductor active layer of a high resistivity;

a drain layer of a second conductivity type formed in a common surface of the drift layer;

a base layer of the second conductivity type formed in the common surface of the drift layer;

a source layer of the first conductivity type formed in a surface of the base layer;

a drain electrode arranged in contact with the drain layer;

a source electrode arranged in contact with the source and base layers; and a main gate electrode facing, through a gate insulating film, a surface of the base layer which is interposed between the source layer and the drift layer, and is located on a side facing the drain layer, wherein the base layer comprises first and second portions facing each other through an intervening portion which is part of the drift layer, the source layer comprises first and second portions respectively formed in surfaces of the first and second portions of the base layer, a sub-gate electrode is arranged to face, through a gate insulating film, a surface of the first portion of the base layer which is interposed between the first portion of the source layer and the intervening portion, and a surface of the second portion of the base layer which is interposed between the second portion of the source layer and the intervening portion, and further wherein a relay layer of the first conductivity type having a resistivity lower than that of the drift layer is formed in the common surface of the drift layer to have a facing portion which faces the source layer through the base layer under the main gate electrode.

According to a third aspect of the present invention, there is provided a semiconductor device having a lateral IGBT, the IGBT comprising:

a drift layer of a first conductivity type formed by using a semiconductor active layer of a high resistivity;

a drain layer of a second conductivity type comprising first and second portions formed in a common surface of the drift layer;

a base layer of the second conductivity type formed in the common surface of the drift layer between the first and second portions of the drain layer;

a source layer of the first conductivity type formed in a surface of the base layer;

a drain electrode arranged in contact with the drain layer;

a source electrode arranged in contact with the source and base layers; and a main gate electrode comprising first and second portions facing, through a gate insulating film, surfaces of the base layer which are interposed between the source layer and the drift layer, and are located on sides facing the first and second portions of the drain layer, respectively, wherein the base layer comprises first and second portions facing each other through an intervening portion which is part of the drift layer, the source layer comprises first and second portions respectively formed in surfaces of the first and second portions of the base layer, a sub-gate electrode is arranged to face, through a gate insulating film, a surface of the first portion of the base layer which is interposed between the first portion of the source layer and the intervening portion, and a surface of the second portion of the base layer which is interposed between the second portion of the source layer and the intervening portion, and further wherein a relay layer of the first conductivity type having a resistivity lower than that of the drift layer is formed in the common surface of the drift layer to have first and second facing portions which face the first and second portions of the source layer through the first and second portions of the base layer under the first and second portions of the main gate electrode, respectively.

In a semiconductor device having a lateral IGBT according to the present invention, a relay layer is formed in a surface of a drift layer to face a source layer through a base layer under a main gate electrode. With this arrangement, the channel length becomes shorter than that of a conventional structure, so that the channel resistance is decreased to increase current density in its ON state.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 17 is a plan view schematically showing a lateral IGBT according to still another embodiment of the present invention;

FIG. 22 is a cross-sectional view schematically showing the lateral IGBT along line XXII—XXII in FIG. 21;

FIG. 23 is a cross-sectional view schematically showing the lateral IGBT along line XXIII—XXIII in FIG. 21;

DETAILED DESCRIPTION OF THE INVENTION

Figure 1:
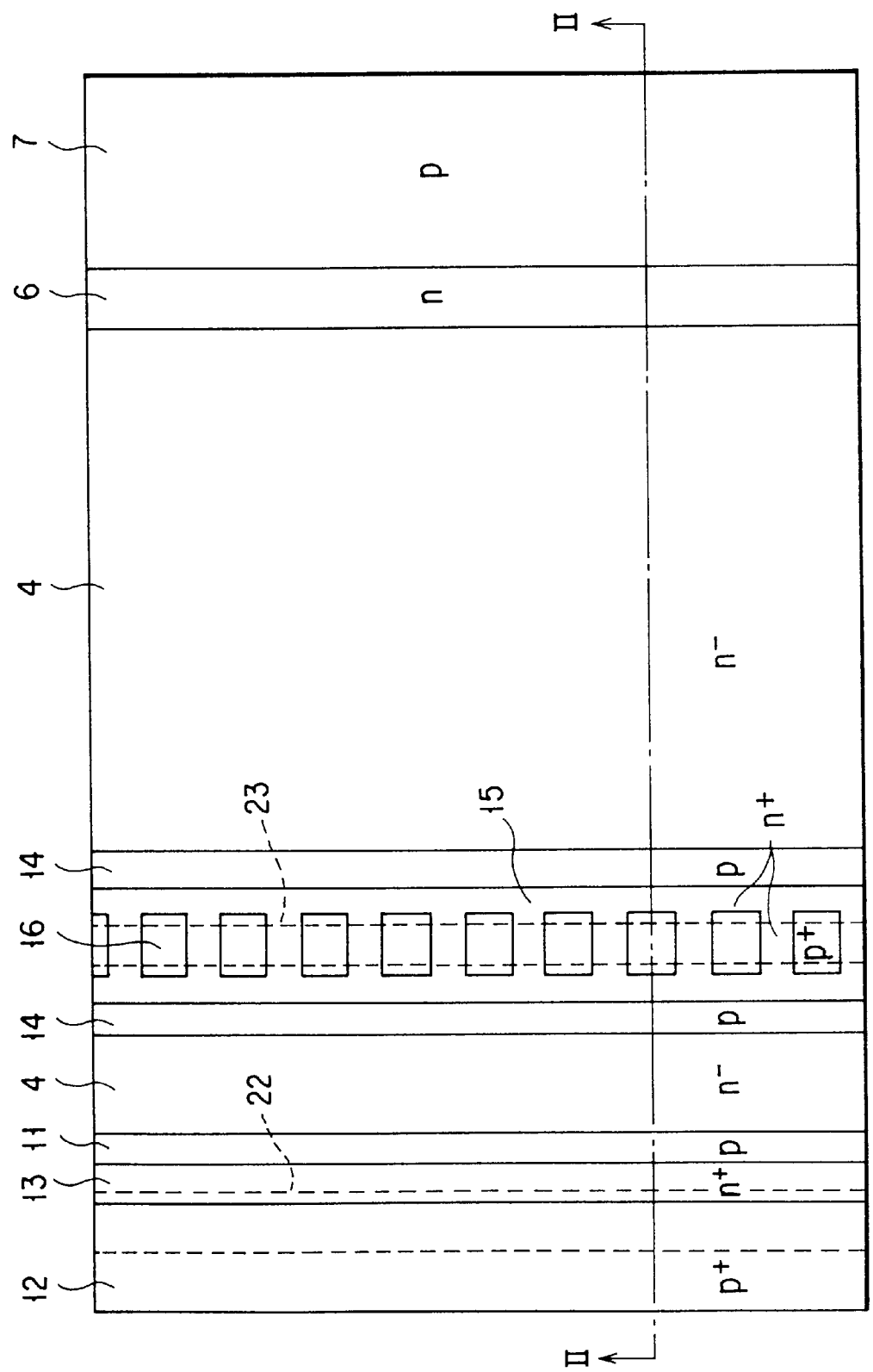
FIG. 1 is a plan view schematically showing a lateral IGBT according to an embodiment of the present invention.
Figure 2:
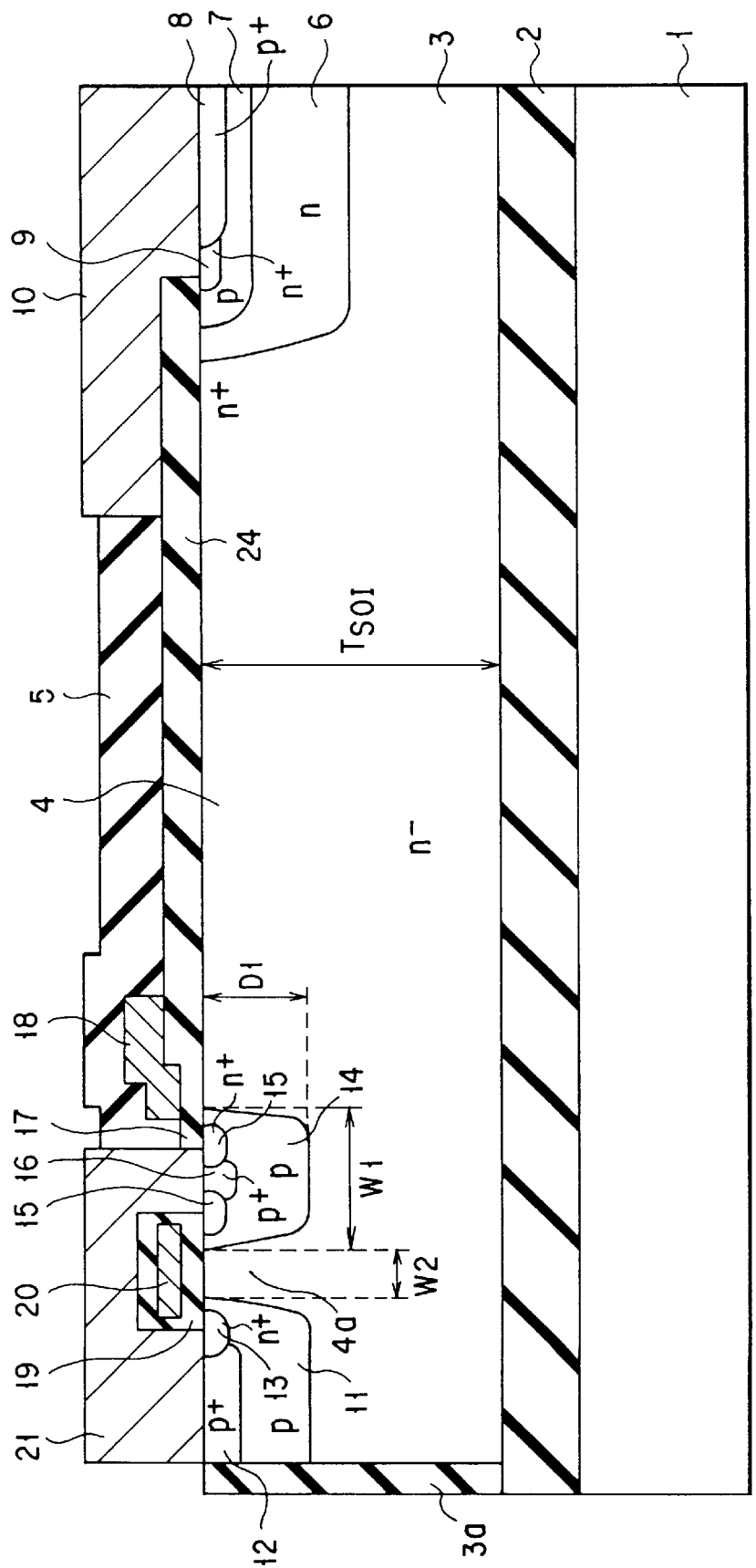
FIG. 2 is a cross-sectional view schematically showing the lateral IGBT along line II—II in FIG. 1.

FIG. 1 is a plan view schematically showing a lateral IGBT according to an embodiment of the present invention, while FIG. 2 is a cross-sectional view schematically showing the lateral IGBT along line II—II in FIG. 1.

An n-type silicon active layer (SOI semiconductor film) 3 having a high resistivity (low impurity concentration) is arranged on a silicon supporting body 1 through a silicon oxide film (SOI insulating film) 2. An SOI substrate is constituted by the silicon supporting body 1, silicon oxide film 2, and n-type silicon active layer 3.

The n-type silicon active layer 3 is used as an n-type drift layer 4. Note that it is not essential for the n-type drift layer 4 to be in direct contact with the silicon oxide film 2. For example, an n-type layer having a low resistivity may be arranged in the n-type silicon active layer 3 between the n-type drift layer 4 and the silicon oxide film 2.

First and second p-type base layers 11 and 14 having a strip shape are selectively formed in the surface of the n-type drift layer 4 so as to sandwich therebetween an intervening portion 4a which is part of the n-type drift layer 4. First and second n-type source layers 13 and 15 having a low resistivity (high impurity concentration) are respectively and selectively formed in the surface of the first and second p-type base layer 11 and 14. The first n-type source layer 13 has a strip shape, while the second n-type source layer 15 has a strip shape resembling a ladder, as shown in FIG. 1.

The p-type base layers 11 and 14 are arranged separate from each other along a direction which is prevailing in lines connecting the n-type source layers 13 and 15 to a p-type drain layer described later. This separating direction can be considered as a prevailing direction along which electrons drift between the source and drain, i.e., drifting direction.

A main gate electrode 18 is arranged to face, through a gate oxide film 17, a surface of the second p-type base layer 14 which is interposed between the second n-type source layer 15 and the n-type drift layer 4. A sub-gate electrode 20 is arranged, through a gate oxide film 19, over a surface between the first and second n-type source layer 13 and 15. In other words, the sub-gate electrode 20 faces, through the gate oxide film 19, a surface of the first p-type base layer 11 which is interposed between the first n-type source layer 13 and the intervening portion 4a of the n-type drift layer 4, and also faces, through the gate oxide film 19, a surface of the second p-type base layer 14 which is interposed between the second n-type source layer 15 and the intervening portion 4a of the n-type drift layer 4.

In this embodiment, three n-type MOSFETs are constituted so as to form three n-type channels, one of which is in the first p-type base layer 11 while two of which are in the second p-type base layer 14.

The main gate electrode 18 and sub-gate electrode 20 may be formed integral, or may be formed independent of each other with, e.g., an Al wiring layer electrically connecting them.

A source electrode 21 is arranged on the first and second n-type source layers 13 and 15 and the first and second p-type base layers 11 and 14. The source electrode 21 is in contact with the first p-type base layer 11 through a p-type contact layer 12 having a low resistivity, and is also in contact with the second p-type base layer 14 through a p-type contact layer 16 having a low resistivity.

An n-type buffer layer 6 is selectively formed in the n-type drift layer 4 and is separated from the p-type base layer 14 by a predetermined distance. A p-type drain layer 7 is selectively formed in the surface of the n-type buffer layer 6.

A p-type contact layer 8 and an n-type layer 9 each having a low resistivity are selectively formed in the surface of the p-type drain layer 7. A drain electrode 10 is arranged on the p-type contact layer 8 and the n-type layer 9. The drain electrode 10 is in contact with the p-type drain layer 7 through the p-type contact layer 8. The n-type layer 9 works for decreasing the drain injection efficiency, i.e., injection efficiency of holes from the p-type drain layer 7, so that a turn-off operation is performed at a high speed.

In FIGS. 1 and 2, there are also shown an embedded insulating film 3a for trench isolation, insulating films (oxide films) 5 and 24, and contact holes 22 and 23 for forming contacts between the p-type base layer 11 and the source electrode 21 and between the p-type base layer 14 and the source electrode 21, respectively.

The contact hole 23 is strip shaped. With this arrangement, since the second n-type source layer 15 has a ladder shape, the width W1 of the p-type base layer 14 can be small. The contact hole 22 is also strip shaped.

In this embodiment, three n-type channels can be formed by the three n-type MOSFET formed of the first and second p-type base layers 11 and 14 and so forth. As a result, the channel width is effectively increased thereby lowering the resistance of the channels as a whole, as compared with a conventional lateral IGBT which has only one n-type channel. It follows that the current density per unit surface area is increased, thereby allowing a chip size to be compact.

In this embodiment, the width W1 of the second p-type base layer 14 should be small for increasing the current density. More specifically, the width W1 is set preferably at 10 $\mu$m or less. Where the width is set at 6 $\mu$m or less, the current density becomes about twice as large.

The depth D1 of the second p-type base layer 14 should be small. The depth D1 is set preferably at 6 $\mu$m or less, and more preferably at 4 $\mu$m or less.

As the thickness $T_{SOI}$ of the n-type drift layer 4 grows larger, electrons from a channel more distant from the drain are caused to be injected more easily, thereby enhancing the effects of the present invention. The thickness $T_{SOI}$ is set preferably at 7 μm or more, and more preferably at 10 μm or more. By doing so, the effects of arranging a plurality of channels are further enhanced.

In relation to the width W1 of the second p-type base layer 14, the thickness $T_{SOI}$ should be set to satisfy $W1<T_{SOI}$. With this relationship, electrons injected into the n-type drift layer 4 from the n-type source layers 13 and 15 through the channels formed by the sub-gate electrode 20 are allowed to easily flow toward the drain. As a result, the ON voltage and ON resistance of the device are decreased.

The distance between the first and second p-type base layers 11 and 14, i.e., the width W2 of the intervening portion 4a is set preferably at 7 μm or more, and more preferably at 10 μm or more. With this arrangement, resistance in the depth direction, i.e., vertical resistance, within the channel region is decreased, thereby improving device properties.

In relation to the depth D1 of the second p-type base layer 14, the width W2 should be set to satisfy $W2 \geq D1$. With this relationship, it is possible to decrease resistance in the depth direction within the intervening portion 4a, when a depletion layer is formed to extend from the p-type base layer into the n-type drift layer 4.

Where the gate oxide films 17 and 19 are set thin, the current during application of a high voltage is decreased, so that the device is hardly broken when a resistor connected to the device is short-circuited. More specifically, if the resistor is short-circuited, a power supply voltage is directly applied to the device. For example, a power supply of DC 300V is used, a voltage drop of 300V is caused in the device while the gates are turned on, thereby causing a large current to flow through the device. In order to protect the device from this large current, the device should limit the current flowing therethrough by itself.

Where the gate oxide films 17 and 19 are set thin, a gate voltage can be decreased, so that the ON resistance of the device is decreased. On the other hand, where a voltage drop within a channel formed by application of the gate voltage is beyond the gate voltage, the current flowing through the device is not increased any more. In other words, the current, which flows when the resistor is short-circuited, can be decreased by lowering the gate voltage. With a small current flowing through the device, the generated heat becomes small, so that the device is not broken for a short period of time. If a device protection circuit can detect this abnormal state and shut down the device within this short period of time, the device is not broken. This effect is enhanced, where the gate oxide films 17 and 19 are set at 60 nm or less, and more preferably at 30 nm or less.

A method of manufacturing the lateral IGBT according to the embodiment is as follows:

At first, the SOI substrate having the silicon substrate 1, silicon oxide film 2, and n-type silicon layer 3 is formed by means of a direct bonding method. The thickness of the n-type silicon layer 3 is set at, e.g., about 10 μm.

Then, trenches are formed in the n-type silicon layer 3 to reach the silicon oxide film 2, and the embedded insulating films 3a are formed in the trenches, so that a power device (IGBT) region, i.e., the drift layer 4 is isolated.

Then, the entire exposed surface of the n-type drift layer is oxidized to form a thin oxide film having a thickness of about 0.1 μm. Further, a nitride film is formed on the oxide film. Then, the oxide and nitride films are removed except for the source and drain regions.

Then, the overall surface is subjected to oxidation, so that the thick oxide film 24 having a thickness of about 1 μm is formed outside the regions where the nitride film is left.

Then, the nitride film is removed and the n-type buffer layer 6 is formed by means of diffusion. Then, the thin oxide film is removed and the gate oxide films 17 and 19 are formed.

Then, a polysilicon film is formed and patterned to form the gate electrodes 18 and 20.

Then, the p-type base layers 11 and 14, and p-type drain layer 7, which have a depth of about 4 μm, are formed, using the gate electrodes 18 and 20, and oxide film 24 as masks. Then, p-type contact layers 12 and 16 are formed by means of ion implantation of boron at a dose of $1 \times 10^{15}$ cm$^{-2}$.

Then, the n-type source layers 13 and 15, and the n-type layer 9 are formed by means of diffusion, and the p-type contact layer 8 is formed by means of diffusion, using the gate electrodes 18 and 20, and oxide film 24 as masks.

Then, the oxide film 5 is formed overall and patterned along with other insulating films, so that the contact holes are formed.

Finally, the drain and source electrodes 10 and 21 are formed to complete the lateral IGBT. The drain electrode 10 is formed such that the effect of a field plate is obtained.

Figure 3:
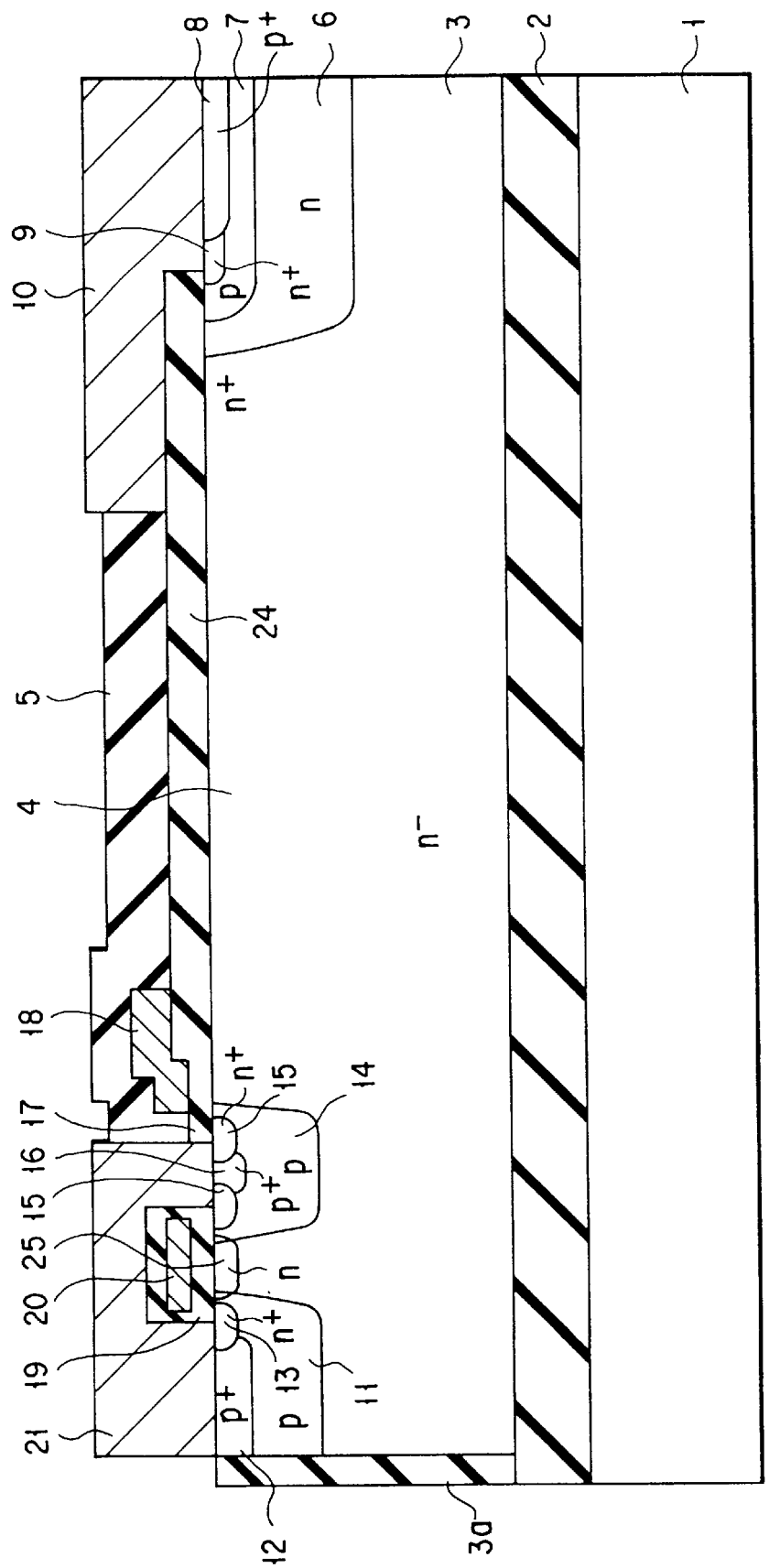
FIG. 3 is a cross-sectional view schematically showing a lateral IGBT according to another embodiment of the present invention.

FIG. 3 is a cross-sectional view schematically showing a lateral IGBT according to another embodiment of the present invention. In FIG. 3, the parts corresponding to those of the lateral IGBT shown in FIG. 2 are provided with reference symbols the same as those in FIG. 2, and their detailed explanation will be omitted. In the drawings after FIG. 3, this is done in the same manner.

The lateral IGBT according to this embodiment differs from the embodiment shown in FIG. 2 in that a shallow n-type diffusion layer 25 is formed in the surface of an intervening portion 4a arranged under a sub-gate electrode 20. With this arrangement, the gate region has a small resistance in the depth direction, so that the ON resistance of the device is decreased. The n-type diffusion layer 25 overlaps p-type base layers 11 and 14.

Figure 4:
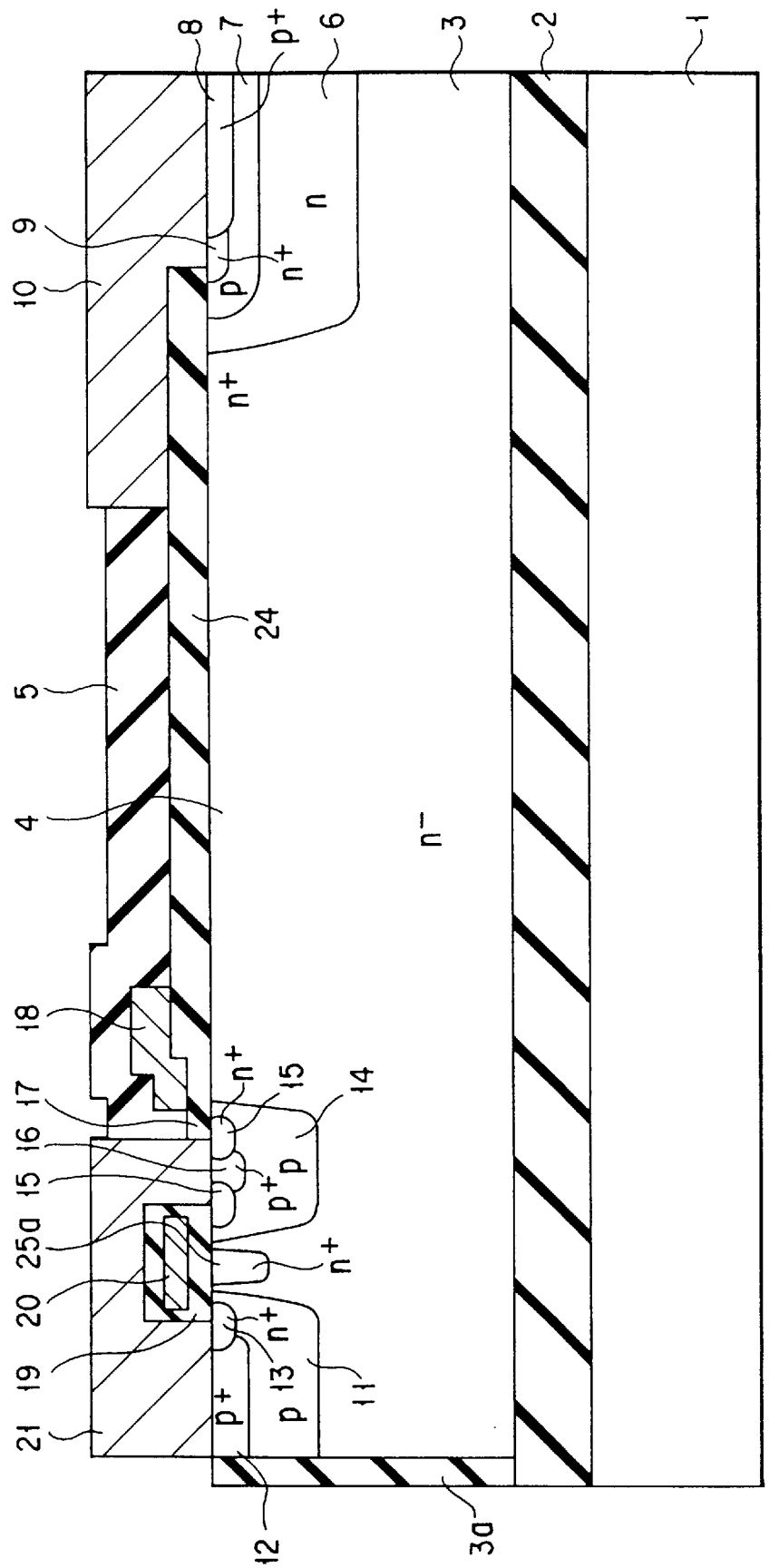
FIG. 4 is a cross-sectional view schematically showing a lateral IGBT according to still another embodiment of the present invention.

FIG. 4 is a cross-sectional view schematically showing a lateral IGBT according to still another embodiment of the present invention. The lateral IGBT according to this embodiment differs from the embodiment shown in FIG. 2 in that a deep n-type diffusion layer 25a having a low resistivity is formed in the surface of an intervening portion 4a arranged under a sub-gate electrode 20. With this arrangement, the gate region has a small resistance in the depth direction, so that the ON resistance of the device is decreased. The n-type diffusion layer 25a does not overlap p-type base layers 11 and 14.

Figure 5:
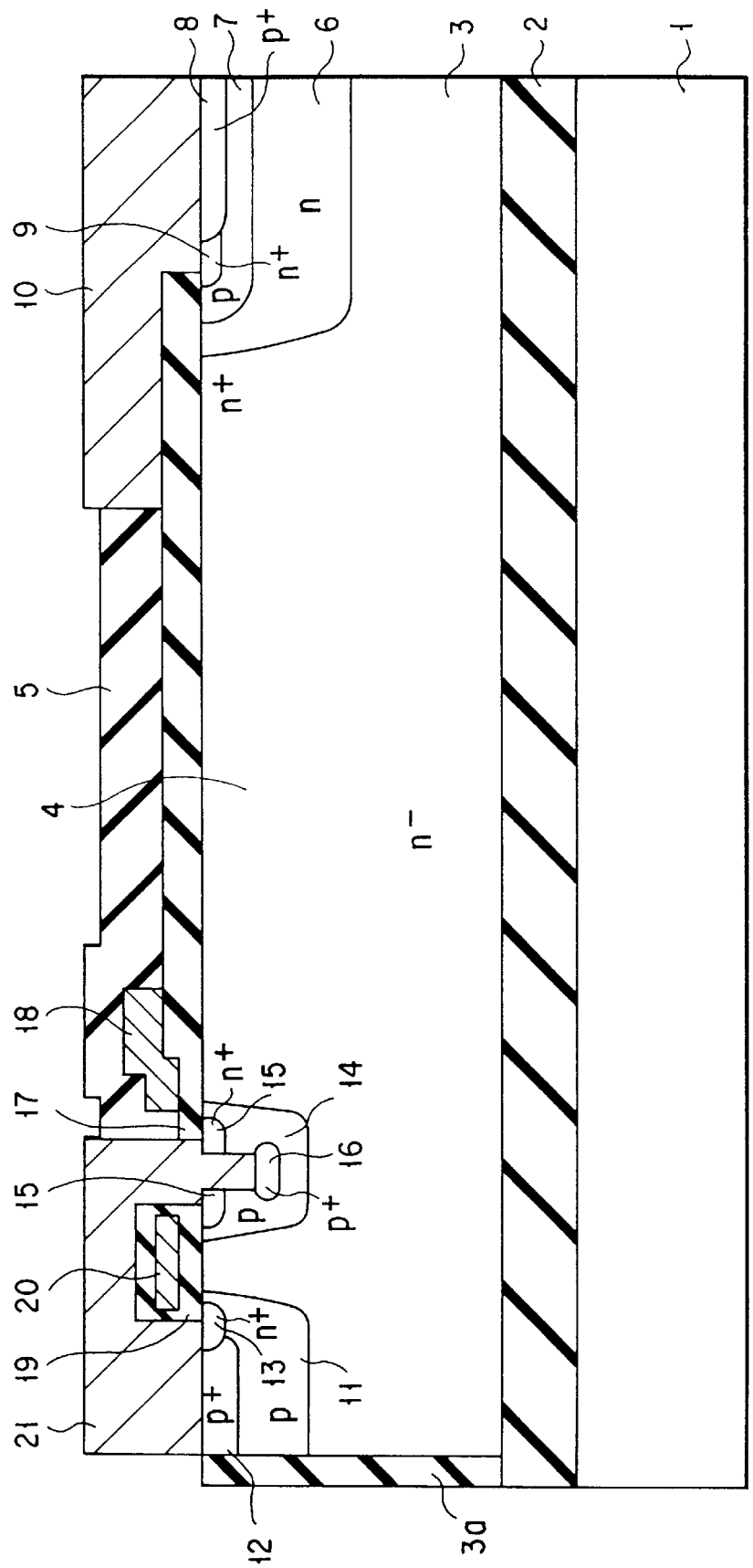
FIG. 5 is a cross-sectional view schematically showing a lateral IGBT according to still another embodiment of the present invention.

FIG. 5 is a cross-sectional view schematically showing a lateral IGBT according to still another embodiment of the present invention. The lateral IGBT according to this embodiment differs from the embodiment shown in FIG. 2 in that a source electrode 21 penetrates an n-type source layer 15 and is in contact with a p-type base layer 14 through a p-type contact layer 16. In other words, a contact between the source electrode 21 and the p-type base layer 14 is formed, using a shallow trench. With this arrangement, the p-type base layer 14 has a small resistance (lateral resistance) between the source electrode 21 and a portion right under the n-type source layer 15 closest to the drain, so that a latch-up phenomenon is effectively prevented.

Figure 6:
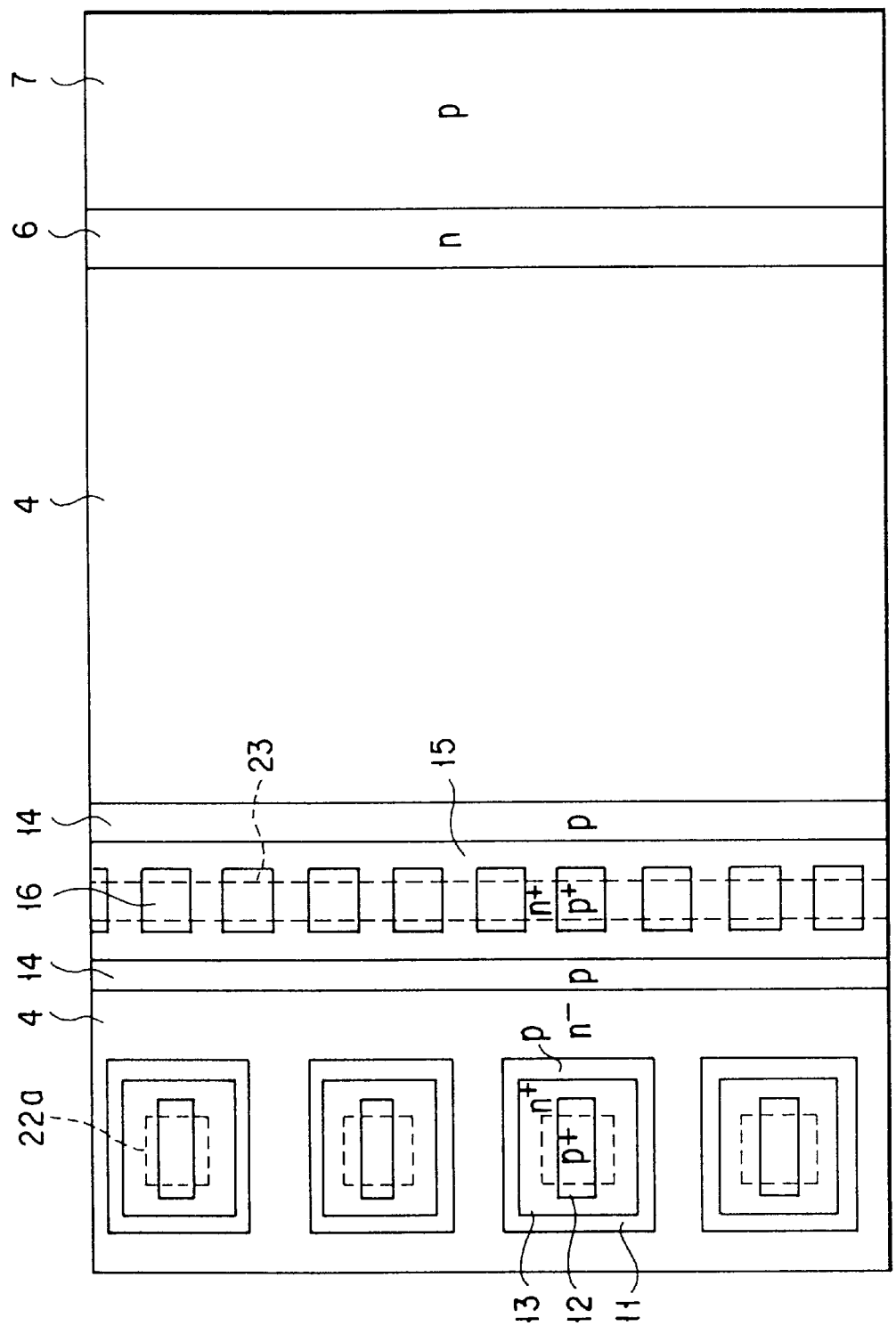
FIG. 6 is a plan view schematically showing a lateral IGBT according to still another embodiment of the present invention.

FIG. 6 is a plan view schematically showing a lateral IGBT according to still another embodiment of the present invention. The lateral IGBT according to this embodiment differs from the embodiment shown in FIG. 2 in that an n-type source layer 13 is formed as islands. With this arrangement, n-type channels are formed in a direction parallel to the drifting direction, as well as a direction perpendicular to the drifting direction, so that the channel width is increased and the ON resistance of the device is lowered, thereby improving the current driving performance.

Note that the present invention is not limited to the above described embodiments. For example, in the embodiments, there are two p-type base layers to increase the number of channels. The number of p-type base layers may be three or more to further increase the number of channels, so that the current density may be further increased.

As described above, a lateral IGBT according to the present invention, each of a p-type base layer and an n-type source layer has two portions facing each other with an intervening portion 4a, which is part of an n-type drift layer 4, interposed therebetween, and a sub-gate electrode 20 is arranged thereon, so that the channel resistance of the device is lowered as a whole. As a result, the lateral IGBT can increase the amount of current by 30% or more, as compared to a conventional IGBT having a main gate electrode only.

However, the surface area of the device is increased by a certain degree corresponding to the source region enlarged by adding the sub-gate electrode 20. Since the current density of a lateral device is defined on the basis of a surface area including the source, drift and drain regions, it is preferable to set the source region smaller in order to increase the current density.

Figure 7:
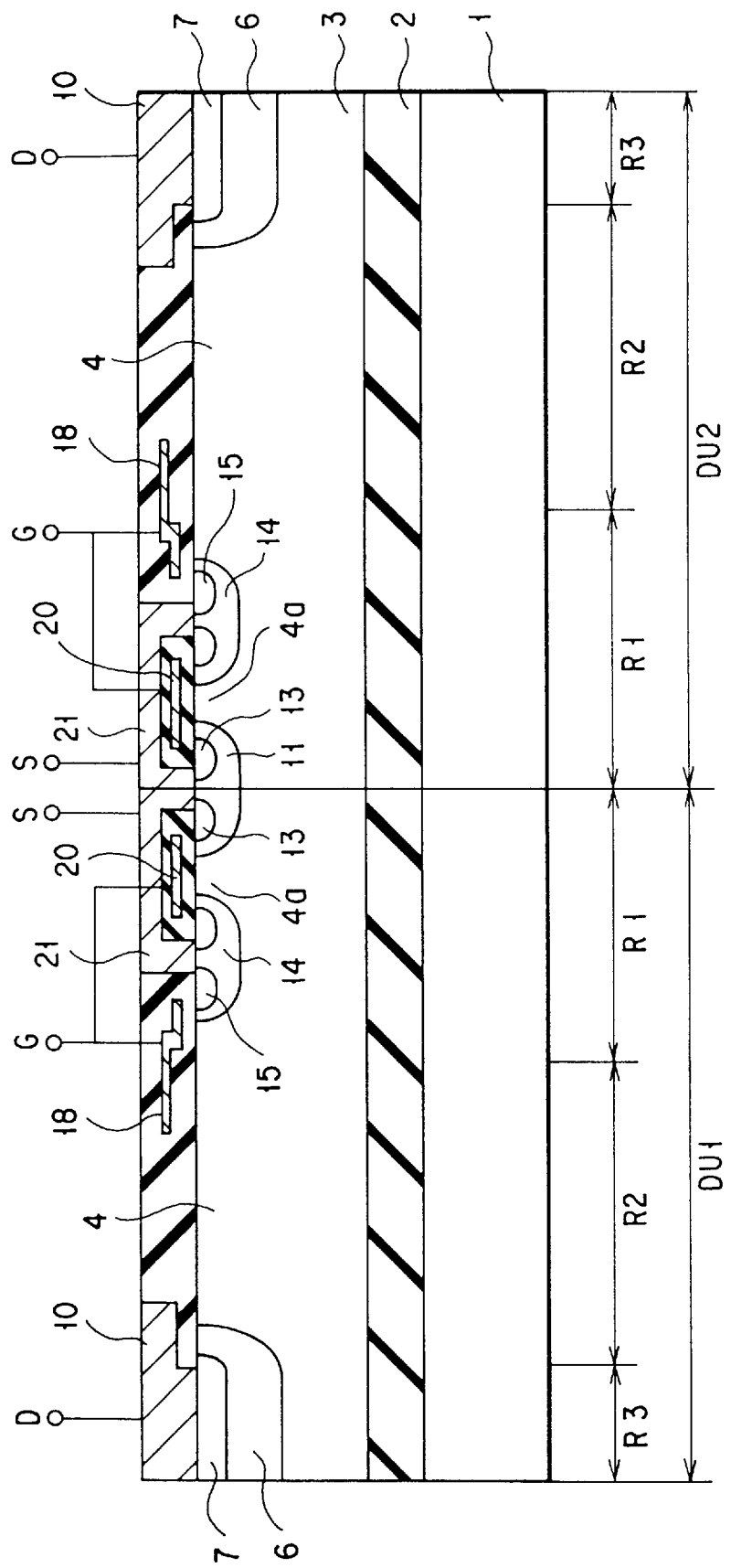
FIG. 7 is a cross-sectional view schematically showing a lateral IGBT according to still another embodiment of the present invention.
Figure 8:
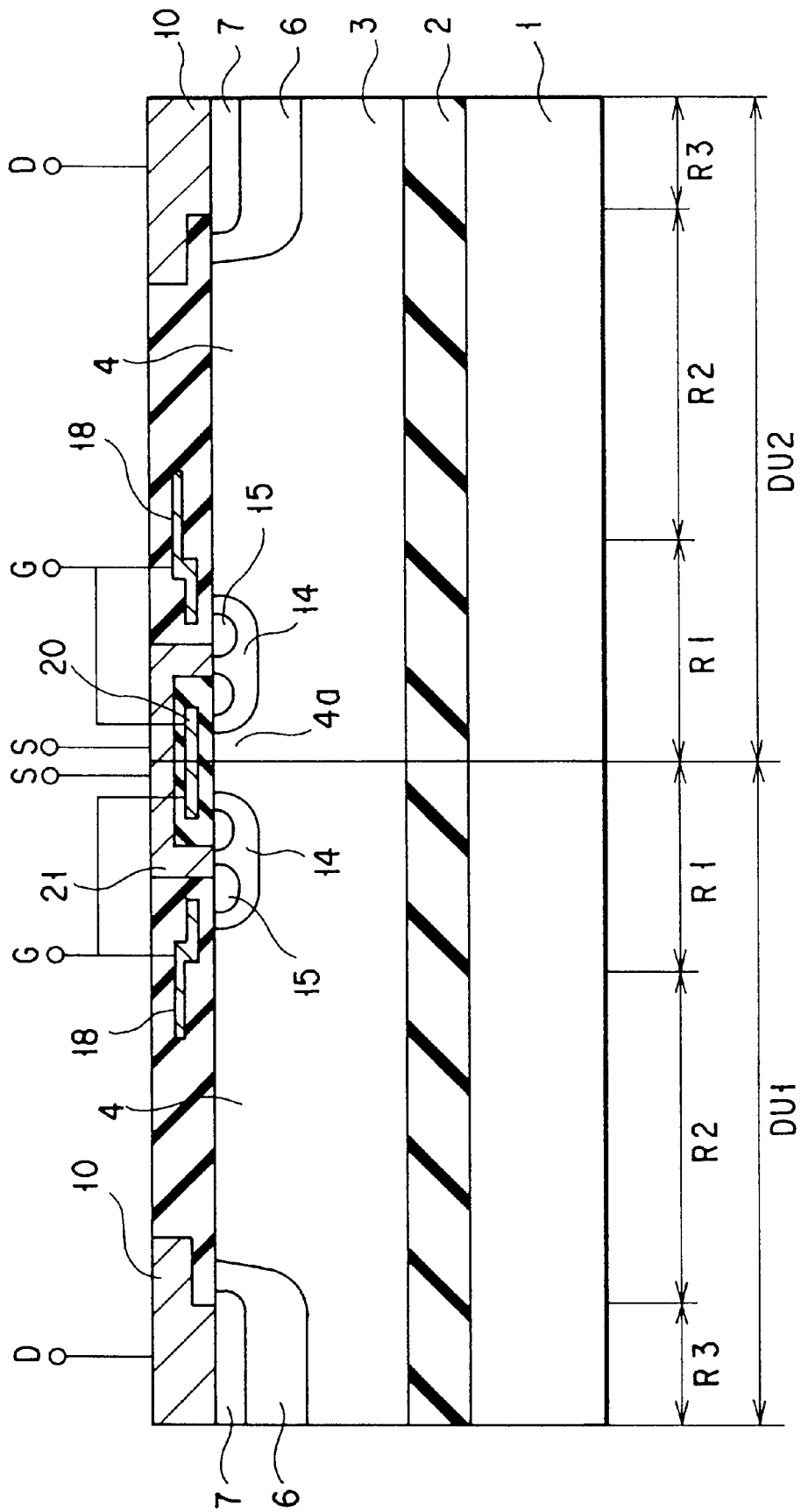
FIG. 8 is a cross-sectional view schematically showing a lateral IGBT according to still another embodiment of the present invention.

For example, as shown in FIGS. 7 and 8, two different lateral IGBTs are provided according to still other embodiments of the present invention, each of which has first and second device units DU1 and DU2 arranged side by side.

In the embodiment shown in FIG. 7, each of the device units DU1 and DU2 has source, drift and drain regions R1, R2 and R3, as in the lateral IGBT shown in FIG. 2. In other words, each of the device units has three n-type MOSFETs, one of which corresponds to a main gate 18, and the other two correspond to a sub-gate electrode 20.

In contrast, in the embodiment shown in FIG. 8, the device units Du1 and DU2 commonly own an intervening portion 4a, which is part of an n-type drift layer 4, and a sub-gate electrode 20. In this case, the third n-type MOSFET of the device unit DU1, which is most distant from the drain region R3 of the device unit DU1, works as the second n-type MOSFET of the adjacent device unit DU2.

In other words, according to the embodiment shown in FIG. 8, a current flowing through a channel formed by the third n-type MOSFET of one device unit basically becomes a current flowing in an adjacent device unit. However, the amount of the current flowing through the third channel is much smaller than the amount of currents flowing through the first and second channels. Consequently, a voltage drop caused in each of the device units by commonly using the intervening portion 4a and the sub-gate electrode 20 is not so large. Instead, since the width of the source region is decreased with the current amount scarcely reduced, the current density is improved as a whole. Further, the currents respectively flowing through the channels become uniform, so that a latch-up phenomenon is hardly caused and the withstand capacity of the device upon short-circuiting of a resistor is increased.

In the lateral IGBTs shown in FIGS. 7 and 8, each of the p-type base layer and the n-type source layer may be divided into two portions facing each other through the intervening portion 4a, as shown in FIGS. 1 and 6. Instead, the two portions of the p-type base layer facing each other through the intervening portion 4a may consist of two opposite portions of an integrated single layer.

Figure 9:
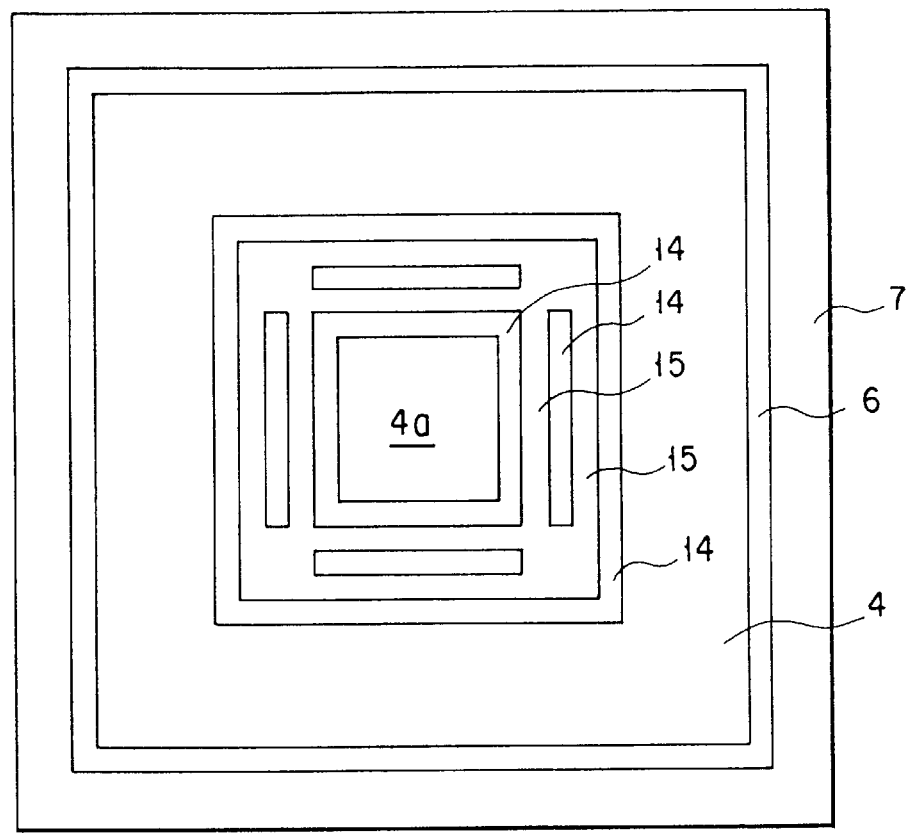
FIG. 9 is a plan view schematically showing a lateral IGBT according to still another embodiment of the present invention.

In a lateral IGBT shown in FIG. 9, according to still another embodiment of the present invention, an intervening portion 4a, which is part of an n-type drift layer 4, is arranged at the center, and a p-type base layer 14, an n-type source layer 15, the drift layer 4, a drain layer 7, and so forth, each having a ring shape, are coaxially arranged.

In a lateral IGBT shown in FIG. 17, according to still another embodiment of the present invention, a base layer 14 is formed to surround a drain layer 7. As compared to the structure shown in FIG. 9, the structure shown in FIG. 17 provides a higher withstand capacity against a latch-up phenomenon, so that it can be turned off even at a large current. The reason of this is as follows.

When the device is turned off, holes flow from a p-type drain layer 7, through an n-type drift layer 4 and a p-type base layer 14, into a source electrode 21. At this time, if the pn junction between the p-type base layer 14 and an n-type source layer 15 is forward-biased by the holes, electrons start being injected from the n-type source layer 15 so as to turn on a parasitic thyristor, thereby causing a latch-up phenomenon.

In the structure shown in FIG. 9, in which the p-type base layer 14 is surrounded by the p-type drain layer 7, since the p-type base layer 14 has a sharp corner again the flow of holes during turn off, a current concentration is caused when the holes flow into the p-type base layer 14. As a result, the pn junction is forward-biased by the holes so as to cause a latch-up phenomenon. Further, the contact length between the p-type base layer 14 and the source electrode 21 is smaller than the length of the channel region. As a result, resistance against the holes passing through the p-type base layer 14 is increased, so that the pn junction is further forward-biased to cause a latch-up phenomenon.

In contrast, in the structure shown in FIG. 17, in which the p-type drain layer 7 is surrounded by the p-type base layer 14, since the above described problems are solved, no latch-up phenomenon is caused.

Note that a cross-sectional view of each of the lateral IGBTs shown in FIGS. 9 and 17 is substantially the same as that shown in FIG. 8.

Figure 10:
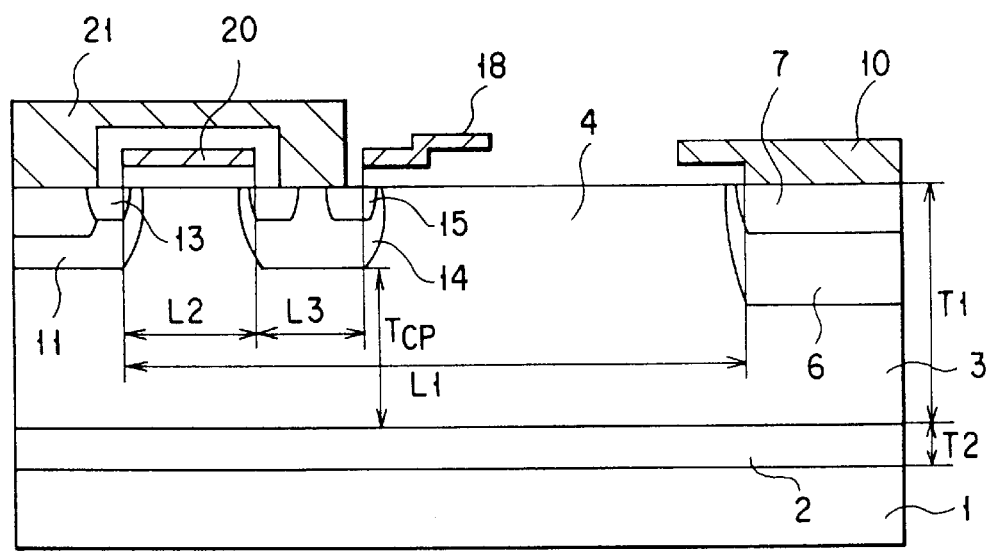
FIG. 10 is a cross-sectional view schematically showing a reference structure of a device sample (lateral IGBT) for simulation.

An explanation will be give in relation to simulations of device samples, which were conducted, using a lateral IGBT shown in FIG. 10 as a reference structure, in order to confirm the effects of the present invention.

As shown in FIG. 10, a substrate having an n-type silicon active layer 3 arranged on a silicon supporting body 1 through a silicon oxide film 2 was used as a sample substrate for the simulations. A drifting length Li was set at 60 $\mu$m, the thickness T1 of the active layer 3 at 15 $\mu$m, and the thickness T2 of the oxide film 2 at 3 $\mu$m (see FIG. 10), for obtaining a breakdown voltage of 500V. The impurity concentration of the active layer 3 was set at $9.3 \times 10^{14}$ cm$^{-3}$, since it was known that a high breakdown voltage could be obtained at an implantation dose of about $1 \times 10^{12}$ cm$^{-2}$.

A preprocessor MEDIT was employed for forming device structure data. A two dimensional device simulator TONADDE2C was employed for simulating current-voltage characteristics. A post-processor VECTOR was employed for outputting current lines used for analyzing characteristics.

Current densities were calculated on the basis of a current per unit surface area over the length of one device unit, but not on the basis of a current per unit sectional area of the device.

Figure 11:
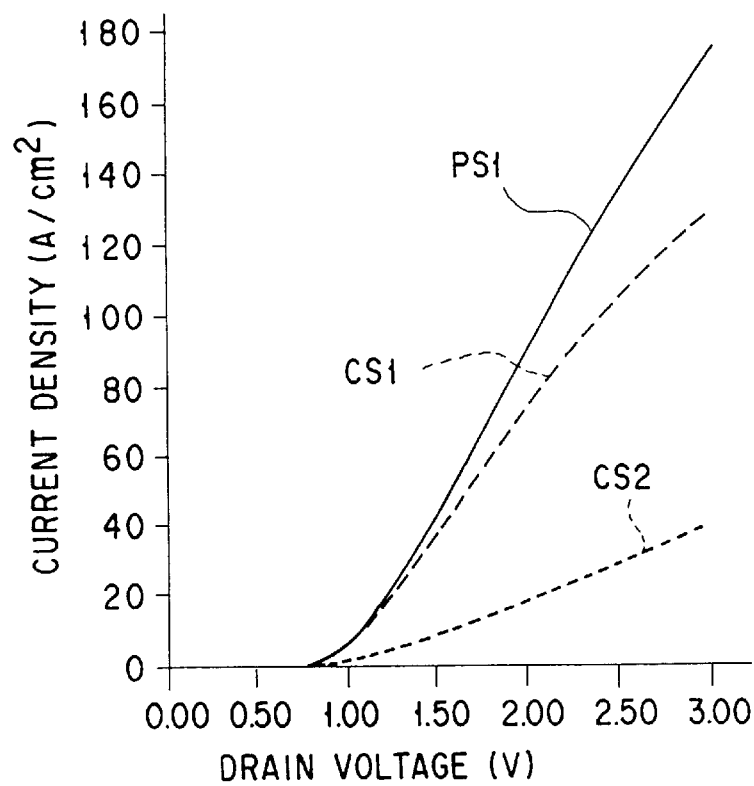
FIG. 11 is a graph showing a simulation result in terms of a characteristic of current densities to voltages.

FIG. 11 is a graph showing a simulation result in terms of a characteristic of current densities to voltages. Three lines shown in FIG. 11 denote characteristics of a present sample PS1 of the present invention having three channels formed by a main gate electrode 18 and a sub-gate electrode 20, a comparative sample CS1 having only one channel formed by the main gate electrode 18, and a comparative sample CS2 having only two channels formed by the sub-gate electrode 20, respectively. Each channel length was set at 1.0 $\mu$m, a sub-gate length L2 at 5 $\mu$m, and a gate-gap length L3 at 6 $\mu$m (see FIG. 10). Note that the sub-gate length L2 and the gate-gap length L3 were used as parameters approximate to the width W2 of the intervening portion 4a and the width W1 of the second p-type base layer 14, respectively, shown in FIG. 2.

As shown in FIG. 11, in the sample CS1 only having the main gate electrode 18 and corresponding to a conventional structure, a current density of 130 A/cm² was obtained. In the sample CS2 only having the sub-gate electrode 20, a current density as low as 30% of that of the sample CS1 was obtained. This was due to a drifting length substantially increased, though the number of channels of sample CS2 was twice as large as that of the sample CS1.

In contrast, in the sample PS1 of the present invention, a current density of 175 A/cm² was obtained. This current density of the sample PS1 was a value obtained by simply summing up the current densities of the samples CS1 and CS2.

Figure 12:
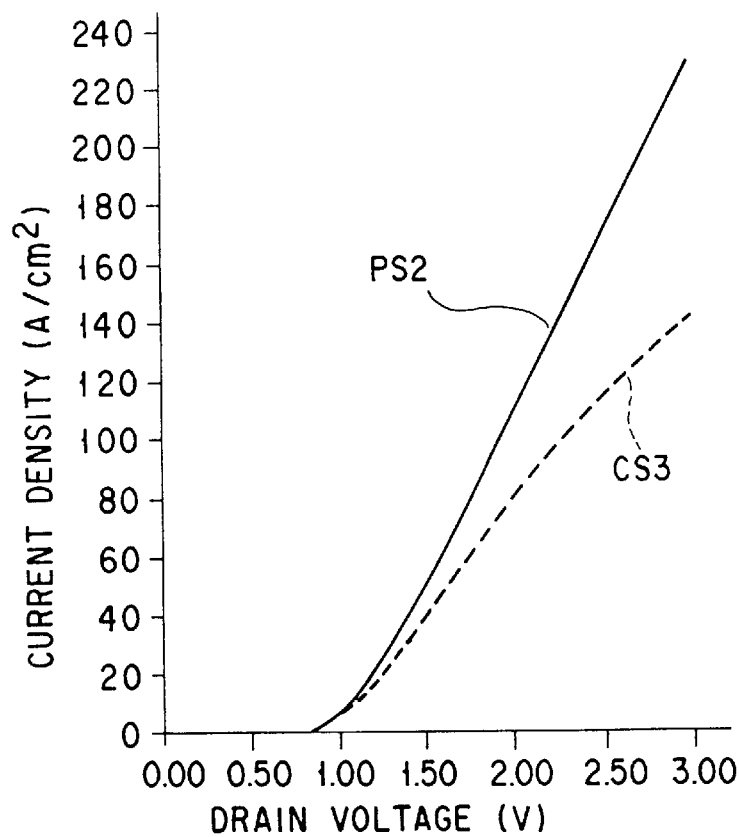
FIG. 12 is a graph showing another simulation result in terms of a characteristic of current densities to voltages.

FIG. 12 is a graph showing another simulation result in terms of a characteristic of current densities to voltages. Two lines shown in FIG. 12 denote characteristics of a present sample PS2 of the present invention having three channels formed by the main gate electrode 18 and the sub-gate electrode 20, and a comparative sample CS3 having only one channel formed by the main gate electrode 18, respectively. The simulation of FIG. 12 was conducted under conditions the same as those of the simulation of FIG. 11, except that the sub-gate length L2 was set at 10$\mu$m and the concentration in the surface of the p-type base layer was set slightly high. Namely, each channel length was set at 1.0 $\mu$m, and the gate-gap length L3 at 6 $\mu$m.

As shown in FIG. 12, in the sample PS2 of the present invention, a current density of 230 A/cm² was obtained, and it was 162% of that produced by the sample CS3 (a conventional structure) having only one channel. From this result, it has been found that the current density is influenced to a great extent by a change of the sub-gate length L2.

Figure 13:
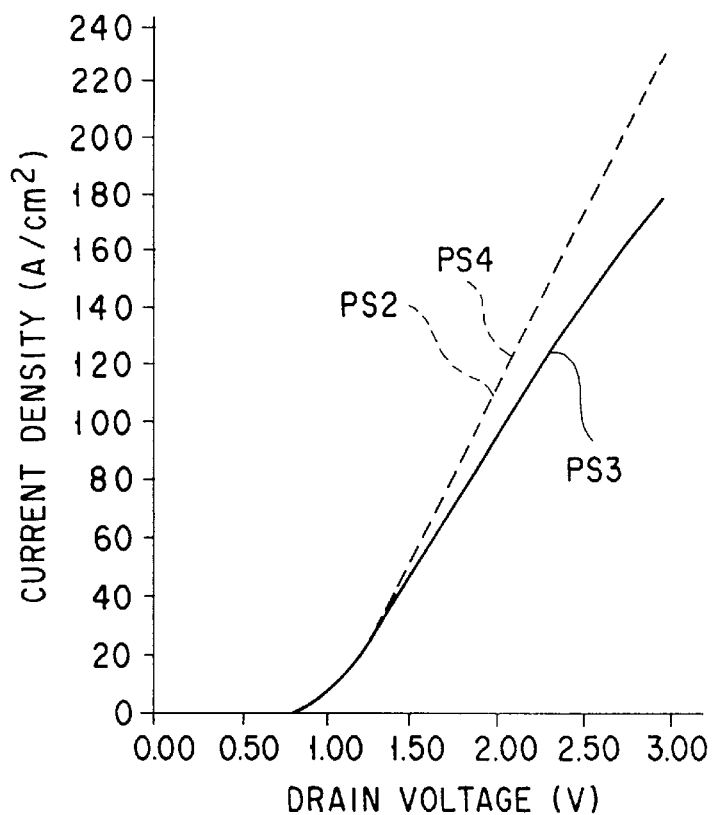
FIG. 13 is a graph showing a simulation result in terms of the influence of the sub-gate length on a characteristic of current densities to voltages.

FIG. 13 is a graph showing a simulation result in terms of the influence of the sub-gate length L2 on a characteristic of current densities to voltages. Three lines shown in FIG. 13 denote characteristics of present samples PS2, PS3 and PS4, respectively, of the present invention having three channels formed by the main gate electrode 18 and the sub-gate electrode 20. The sub-gate length L2 was set at 10 $\mu$m, 5 $\mu$m and 15 $\mu$m in the samples PS2, PS3 and PS4, respectively. The simulation of FIG. 13 was conducted under conditions the same as those of the simulation of FIG. 12, except that the sub-gate length L2 was changed. Namely, each channel length was set at 1.0 $\mu$m, and the gate-gap length L3 at 6 $\mu$m.

As shown in FIG. 13, as compared to the sample PS2 having a sub-gate length L2 of 10 $\mu$m, a decrease in the current density was observed in the sample PS3 having a smaller sub-gate length L2 of 5 $\mu$m, but an increase in the current density was not observed in the sample PS4 having a larger sub-gate length L2 of 15 $\mu$m. This phenomenon is though to have been caused due to a reason as follows.

Under conditions of this simulation, the current passage has a thickness $T_{CP}$ (see FIG. 10) of 10 $\mu$m to 14 $\mu$m in the n-type drift layer 4 under the p-type base layers 11 and 14, judging from the active layer 3 having a thickness of 15 $\mu$m, and the p-type base layers 11 and 14 having a thickness of 1 $\mu$m to 5 $\mu$m. Therefore, where the sub-gate length L2 is set at 10 $\mu$m, the current passage has almost the same thicknesses under the p-type base layer 11 and 14, and right under the sub-gate electrode 20, i.e., at the intervening portion 4a. As a result, the sample PS2 produces a current density as large as 162% of that produced by the sample CS3 (a conventional structure).

On the other hand, where the sub-gate length L2 is decreased down to 5 $\mu$m, a current flow is obstructed when entering the sub-gate electrode 20. In other words, the current passage, which has a thickness of 10 $\mu$m to 14 $\mu$m under the p-type base layers 11 and 14, abruptly becomes narrower right under the sub-gate electrode 20, i.e., at the intervening portion 4a. As a result, an effect of the increased number of channels is not sufficiently utilized.

In contrast, where the sub-gate length L2 is increased up to 15 $\mu$m, the current passage becomes larger right under the sub-gate electrode 20, i.e., at the intervening portion 4a, but has a limited thickness under the p-type base layers 11 and 14. As a result, an effect of the large sub-gate length L2 is not sufficiently utilized.

In short, the thickness of the n-type drift layer 4 under the p-type base layer 11 and 14, and the width of the intervening portion 4a right under the sub-gate electrode 20 should be approximate to each other.

Figure 14:
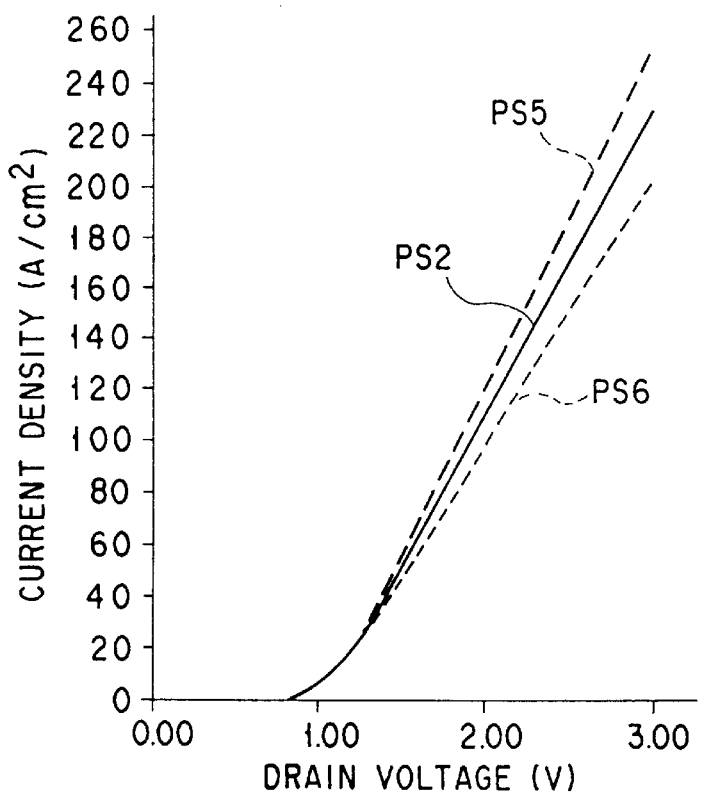
FIG. 14 is a graph showing a simulation result in terms of the influence of the gate-gap length on a characteristic of current densities to voltages.

FIG. 14 is a graph showing a simulation result in terms of the influence of the gate-gap length L3 on a characteristic of current densities to voltages. Three lines shown in FIG. 14 denote characteristics of present samples PS2, PS5 and PS6, respectively, of the present invention having three channels formed by the main gate electrode 18 and the sub-gate electrode 20. The gate-gap length L3 was set at 6 $\mu$m, 3 $\mu$m and 10 Jim in the samples PS2, PS5 and PS6, respectively. The simulation of FIG. 14 was conducted under conditions the same as those of the simulation of FIG. 12, except that the gate-gap length L3 was changed. Namely, each channel length was set at 1.0 $\mu$m, and the sub-gate length L2 at 10 $\mu$m.

As shown in FIG. 14, as compared to the sample PS2 having a gate-gap length L3 of 6 $\mu$m, an increase in the current density was observed in the sample PS5 having a smaller gate-gap length L3 of 3 $\mu$m, and a decrease in the current density was observed in the sample PS6 having a larger gate-gap length L3 of 10 $\mu$m. The sample PS5 produced a current density as large as 118% of that produced by the sample PS6. From this result, it has been found that with a decrease in the gate-gap length L3, the drifting length is shortened so that a better result is obtained, as long as the sub-gate length L2 is set appropriately.

Figure 15:
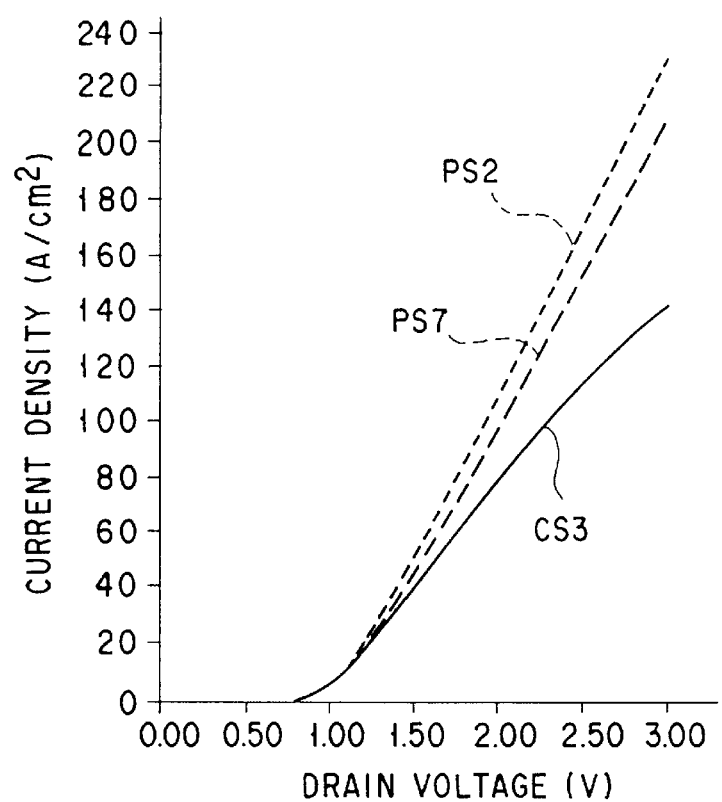
FIG. 15 is a graph showing a simulation result in terms of the influence of the number of channels (the number of MOSFETs) on a characteristic of current densities to voltages.

FIG. 15 is a graph showing a simulation result in terms of the influence of the number of channels (the number of MOSFETS) on a characteristic of current densities to voltages. Three lines shown in FIG. 15 denote characteristics of a present sample PS2 of the present invention having three channels formed by the main gate electrode 18 and the sub-gate electrode 20, a present sample PS7 of the present invention having five channels formed by the main gate electrode 18 and two sub-gate electrodes 20, and a comparative sample CS3 having only one channel formed by the main gate electrode 18, respectively. MOSFETs formed by the second sub-gate electrode 20 of the sample PS7 were arranged on a side distant from the drain. The simulation of FIG. 15 was conducted under conditions the same as those of the simulation of FIG. 12, except that the number of channels (the number of MOSFETs) was changed. Namely, each channel length was set at 1.0 μm, p the sub-gate length L2 at 10 μm and the gate-gap length L3 at 6 μm.

As shown in FIG. 15, or as described above, the sample PS2 of the present invention having three channels produced a current density as large as 162% of that produced by the sample CS3 (a conventional structure) having only one channel. However, the sample PS7 of the present invention having five channels produced a current density lower than that of the sample PS2. This phenomenon is thought to have been caused due to the following reason.

Where the number of channels is five, the drifting length of two channels most distant from the drain is large, and the amount of a current flowing through the two channels into the second sub-gate electrode is very small. Further, where the number of channels is five, the entire length of the device, which is a parameter in calculation of the current density, is increased. As a result, the current density is decreased even though the number of channels is increased.

Figure 16:
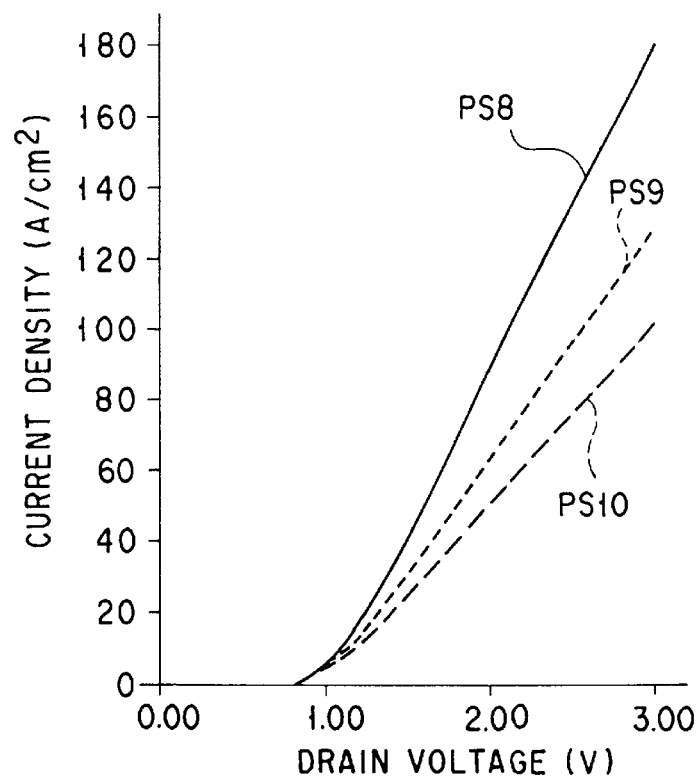
FIG. 16 is a graph showing a simulation result in terms of the influence of each channel length on a characteristic of current densities to voltages.

FIG. 16 is a graph showing a simulation result in terms of the influence of each channel length on a characteristic of current densities to voltages. Three lines shown in FIG. 16 denote characteristics of present samples PS8, PS9 and PS10, respectively, of the present invention having three channels formed by the main gate electrode 18 and the sub-gate electrode 20. Each channel length was set at 1.0 μm, 2.2 μm and 3.0 μm in the samples PS8, PS9 and PS10, respectively. The sub-gate length L2 was set at 12 μm in the samples PS8, PS9 and PS10. The simulation of FIG. 16 was conducted under conditions the same as those of the simulation of FIG. 12, except that each channel length and the sub-gate length L2 were changed. Namely, the gate-gap length L3 was at 6 μm.

As shown in FIG. 16, the current density was increased with a decrease in each channel length. From this result, it has been found that the current density can be greatly improved by adopting a short-channel structure in the device of the present invention.

Figure 18:
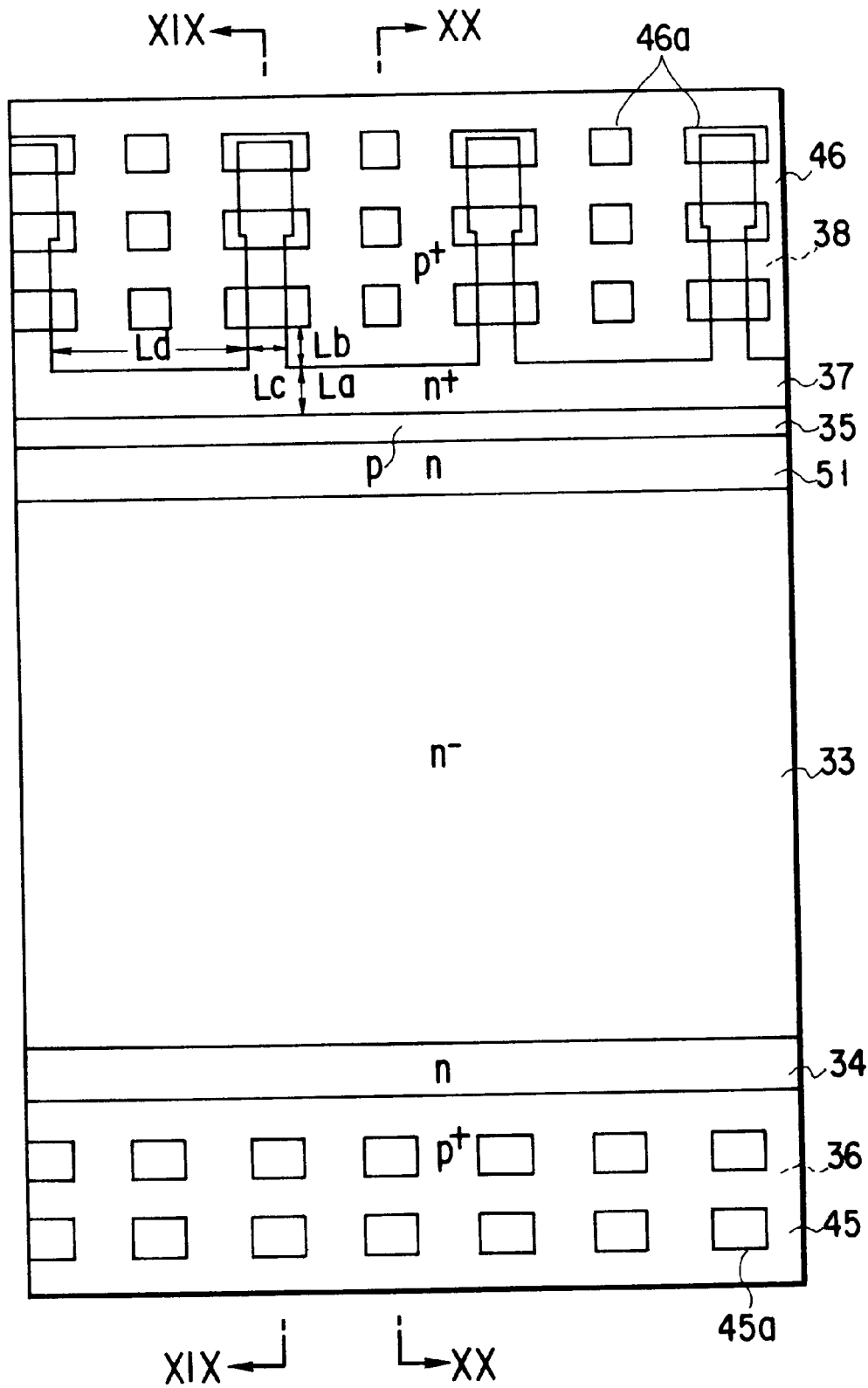
FIG. 18 is a plan view schematically showing a lateral IGBT according to still another embodiment of the present invention.
Figure 19:
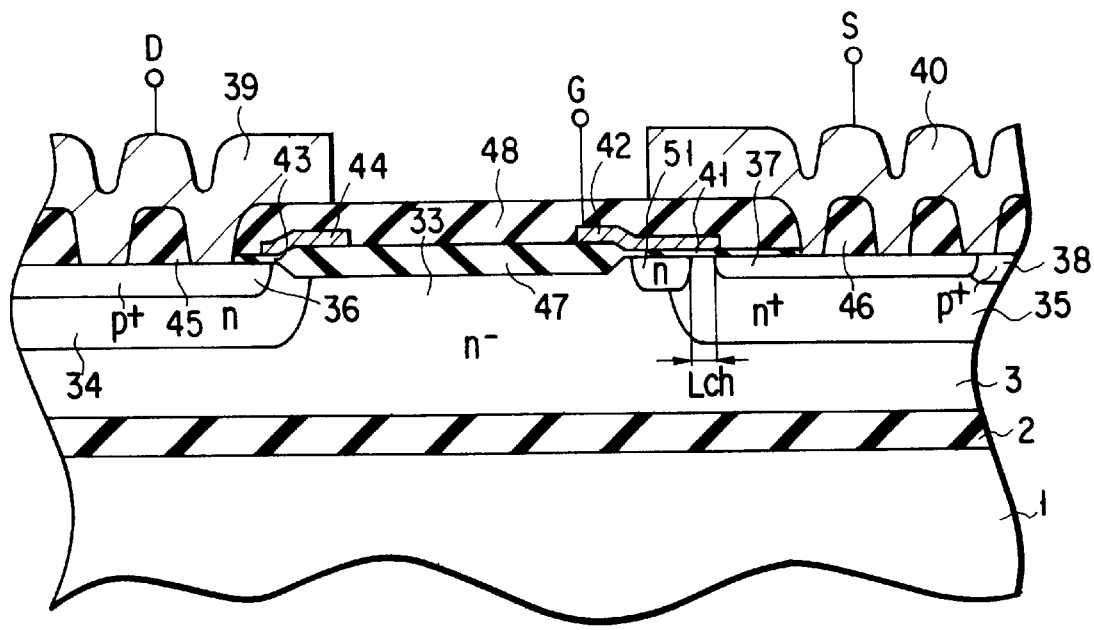
FIG. 19 is a cross-sectional view schematically showing the lateral IGBT along line XIX—XIX in FIG. 18.
Figure 20:
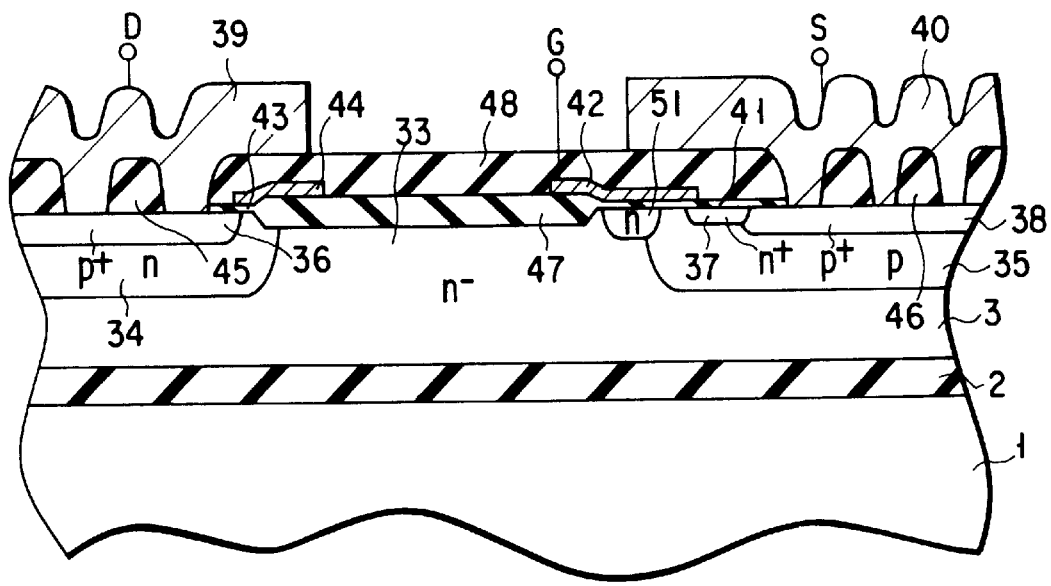
FIG. 20 is a cross-sectional view schematically showing the lateral IGBT along line XX—XX in FIG. 18.

FIG. 18 is a plan view schematically showing a lateral IGBT according to still another embodiment of the present invention, and FIGS. 19 and 20 are cross-sectional views schematically showing the lateral IGBT along line XIX—XIX and line XX—XX in FIG. 18, respectively.

An n⁻-type silicon active layer 3 having a high resistivity (low impurity concentration) is arranged on a silicon supporting body 1 through a silicon oxide film 2. An SOI substrate is constituted by the silicon supporting body 1, silicon oxide film 2, and n⁻-type silicon active layer 3. This IGBT is an output device of a power IC fabricated by making use of the n⁻-type silicon active layer 3, though no peripheral circuit is shown in these drawings.

The n⁻-type silicon active layer 3 is used as an n⁻-type drift layer 33. Note that it is not essential for the n -type drift layer 33 to be in direct contact with the silicon oxide film 2. For example, an n-type layer having a low resistivity may be arranged in the n⁻-type silicon active layer 3 between the n⁻-type drift layer 33 and the silicon oxide film 2.

An n-type buffer layer 34 and a p-type base layer 35 are formed in the surface of the n⁻-type drift layer 33. A p⁺-type drain layer 36 is formed in the surface of the n-type buffer layer 34. An n⁺-type source layer 37 and a p⁺-type contact layer 38 are formed in the surface of the p-type base layer 35 such that they engage with each other by alternately extending portions.

A drain electrode 39 is arranged on the p⁺-type drain layer 36 through an insulating oxide film 45 having openings like a grid. The p⁺-type drain layer 36 is in contact with the drain electrode 39 through the openings 45a of the insulating oxide film 45.

A source electrode 40 is arranged on the n⁺-type source layer 37 and the p⁺-type contact layer 38 through an insulating oxide film 46 having openings like a grid. The n⁺-type source layer 37 and the p⁺-type contact layer 38 are in contact with the source electrode 40 through the openings 46a of the insulating oxide film 46. The n⁺-type source layer 37 resembling a comb in shape is in contact with the source electrode 40 through the teeth of the comb.

Where the contacts to the drain electrode 39 and the source electrode 40 are divided into several portions as described above, current concentration at the edges of each contact can be distributed. As a result, the drain electrode 39 and the source electrode 40 can have a prolonged life.

Insulating oxide films 47 and 48 are arranged on the n⁻-type drift layer 33 between the n-type buffer layer 34 and the p-type base layer 35.

A main gate electrode 42 is arranged to face, through a gate oxide film 41, a surface of the p-type base layer 35 which is interposed between the n⁺-type source layer 37 and the n⁻-type drift layer 33. A field plate 44 is arranged near the boundary between the n⁻-type drift layer 33 and the n-type buffer layer 34 through an insulating film 43. The field plate 44 is short-circuited (not shown) with the drain electrode 39 to relax the electric field on the semiconductor surface.

An n-type relay layer 51 is formed in the surface of the n⁻-type drift layer 33 to face the n⁺-type source layer 37 through the p-type base layer 35 under the main gate electrode 42. The n-type relay layer 51 extends from the n⁻-type drift layer 33 into the p-type base layer 35, so that it has a facing portion formed in the surface of the p-type base layer 35 to face the n⁺-type source layer 37. The n-type relay layer 51 is formed by ion-implanting an n-type impurity, such as phosphorus, at a concentration higher than that of the n⁻-type drift layer 33.

The n-type relay layer 51 can decrease the channel length Lch to be shorter than that of a conventional IGBT, thereby decreasing the channel resistance. Consequently, the current density of the IGBT in its ON state becomes larger. It was confirmed by an experiment that the ON current was increased by from 10% to 20%.

The n-type relay layer 51 is formed by utilizing an ion-implantation (at a dose of about $5 \times 10^{12}$ cm⁻²) for forming an n-type diffusion layer which provides the channel region of a low breakdown-voltage PMOSFET in the peripheral circuit, as described later. Accordingly, the impurity concentration of the n-type relay layer 51 is relatively low, not to damage the breakdown voltage. Since the dose of this ion-implantation is low, the facing portion of the n-type relay layer 51 to be formed in the surface of the p-type base layer 35 may not be fully n-type. Even in such a case, since the p-type concentration in the p-type base layer 35 of the IGBT is substantially lowered, the channel resistance is decreased to attain an effect of increasing the ON current.

Note that, if the n-type relay layer 51 were to be formed by utilizing an ion-implantation for forming the n⁺-type source layer 37, the breakdown voltage of the device would be extremely lowered.

The channel length Lch defined by the distance between the n⁺-type source layer 37 and the n-type relay layer 51 is designed to fall within a range of from about 1 μm to 7 μm. The upper and lower limits of the channel length Lch are decided in light of ON resistance and punch-through breakdown voltage, respectively.

Specifically, the channel length Lch is preferably set to be shorter than the original channel length Lo, i.e., the distance between the n⁺-type source layer 37 and the n⁻-type drift layer 33. This means that the facing portion of the n-type relay layer 51, which faces the n⁺-type source layer 37, has to extend into the surface of the p-type base layer 35. The original channel length Lo varies within a range of from about 1.5 μm to 7 μm, on the basis of the fabricating process. Accordingly, the upper limit of the channel length Lch also varies in this range. On the other hand, it is thought that a sufficient breakdown voltage can be obtained where the lower limit of the channel length Lch is set to be about 1 μm. This is because the main gate electrode 42 also works as a field plate, thereby hardly causing inherent punch-through.

It was confirmed by an experiment that an effect of decreasing the ON resistance was obtained without causing a problem in the breakdown voltage, where the original channel length Lo and the channel length Lch were from about 5 μm to 6 μm, and about 2.6 μm, respectively.

The n-type relay layer 51 is designed to have a surface concentration of an n-type impurity of from $2\times10^{16}$ cm$^{-3}$ to $2\times10^{17}$ cm$^{-3}$, preferably not less than $5\times10^{16}$ cm$^{-3}$, while the n⁻-type drift layer 33 has an n-type impurity concentration of about $1\times10^{15}$ cm$^{-3}$. Note that the surface concentration is defined by the highest value of the n-type impurity concentration near the surface of the n-type relay layer 51. The upper and lower limits of the n-type impurity concentration are decided in light of ON resistance and breakdown voltage, respectively.

Specifically, the n-type impurity concentration of the n-type relay layer 51 is preferably set to be higher than the p-type impurity concentration of the p-type base layer 35. The p-type impurity concentration of the p-type base layer 35 is generally set to be from $1\times10^{17}$ cm$^{-3}$ to $2\times10^{17}$ cm$^{-3}$ at the surface. However, at the position where the n-type relay layer 51 is to be formed, the p-type base layer 35 has been formed by lateral diffusion, and has a lower value of the p-type impurity concentration of from $1\times10^{16}$ cm$^{-3}$ to $2\times10^{16}$ cm$^{-3}$. Accordingly, the n-type impurity concentration of the n-type relay layer 51 is set to be not less than $2\times10^{16}$ cm$^{-3}$, preferably not less than $5\times10^{16}$ cm$^{-3}$, at the surface. On the other hand, it is thought that hardly any breakdown voltage, which is practically necessary, is obtained where the n-type impurity concentration of the n-type relay layer 51 exceeds $2\times10^{17}$ cm$^{-3}$.

It was confirmed by an experiment that an effect of decreasing the ON resistance was obtained without causing a problem in the breakdown voltage, where the n-type impurity concentration of the n-type relay layer 51 was set to be from $9\times10^{16}$ cm$^{-3}$ to $1\times10^{17}$ cm$^{-3}$ at the surface, by ion-implanting phosphorus at a dose of $5\times10^{12}$ cm$^{-2}$.

Figure 21:
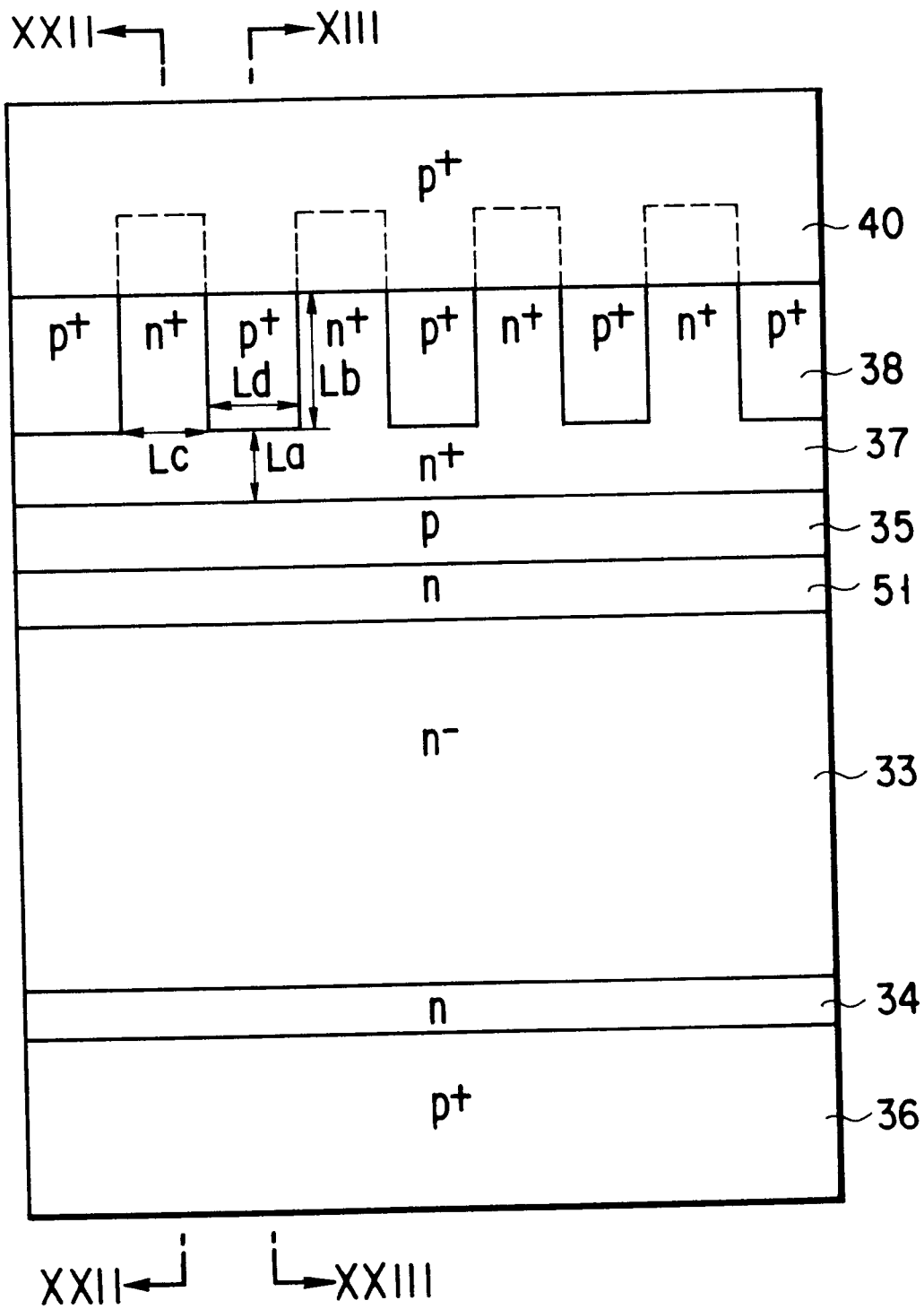
FIG. 21 is a plan view schematically showing a lateral IGBT according to still another embodiment of the present invention.

FIG. 21 is a plan view schematically showing a lateral IGBT according to still another embodiment of the present invention, and FIGS. 22 and 23 are cross-sectional views schematically showing the lateral IGBT along line XXII—XXII and line XXIII—XXIII in FIG. 21, respectively.

The embodiment differs from the latest embodiment in that each of the contacts of a drain layer 36 with a drain electrode 39, and of a source layer 37 and a contact layer 38 with a source electrode 40 is a so-called all-over contact, not a grid-like contact. In other words, the drain electrode 39 is arranged directly on the drain layer 36 without any insulating oxide film 45 having grid-like openings. Similarly, the source electrode 40 is arranged directly on the source layer 36 and the contact layer 38 without any insulating oxide film 46 having grid-like openings.

Figure 24:
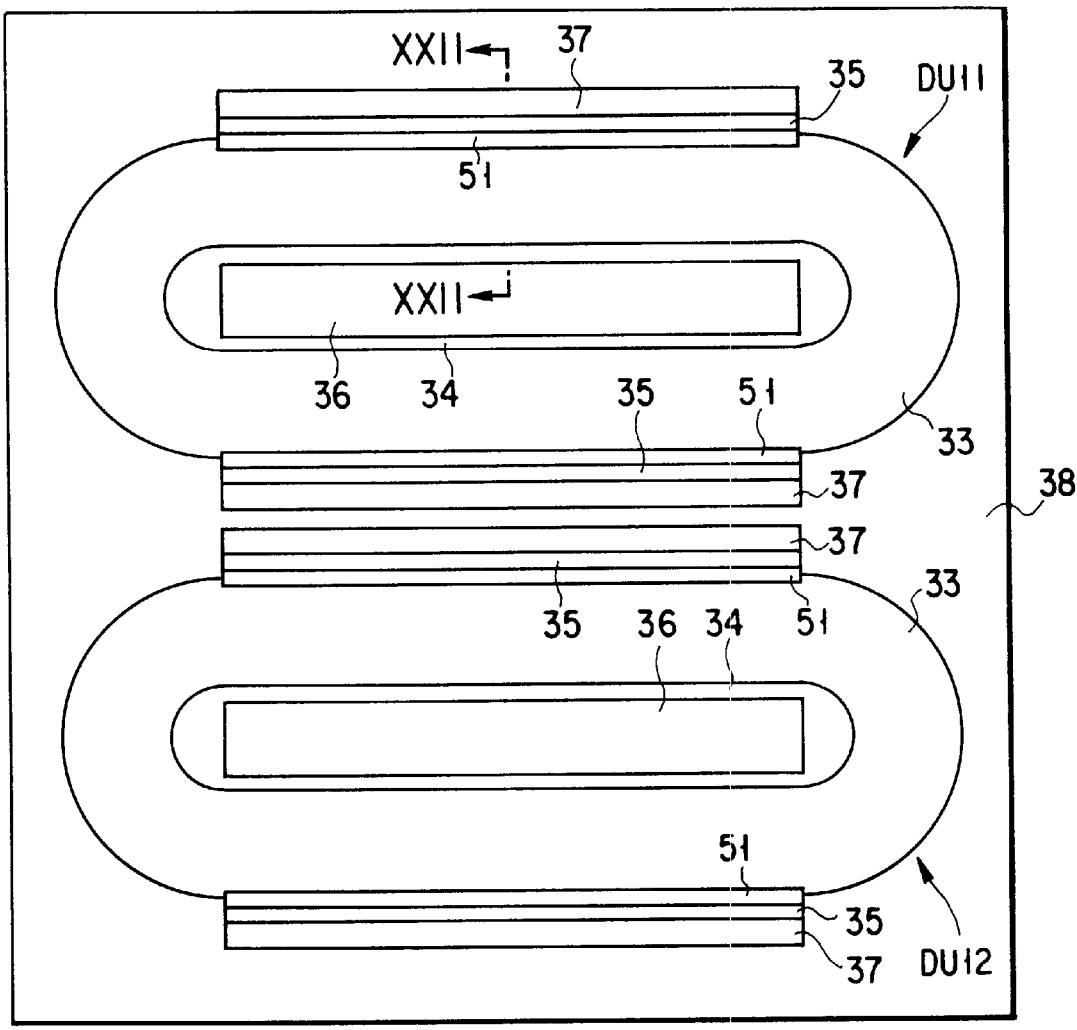
FIG. 24 is a plan view schematically showing a lateral IGBT according to still another embodiment of the present invention.

FIG. 24 is a plan view schematically showing a lateral IGBT according to still another embodiment of the present invention. The cross-sectional view of the lateral IGBT along line XXII—XXII in FIG. 24 is substantially the same as that shown in FIG. 22.

In this embodiment, two device units DU11 and DU12 are arranged side by side. Each of the device units DU11 and DU12 has an arrangement such that a p-type base layer 35 and a p⁺-type contact layer 38 concentrically, completely surround a p⁺-type drain layer 36. With this arrangement, the device units have a high breakdown voltage. Further, current concentration at the base layer 35 and the contact layer 38 is prevented, thereby improving withstand capacity against a latch-up phenomenon to allow a turn-off operation even with a large current. In order to further prevent current concentration at the ends of the device units, semi-circular portions at the left and right ends of the drain layer 35 are removed.

Figure 25:
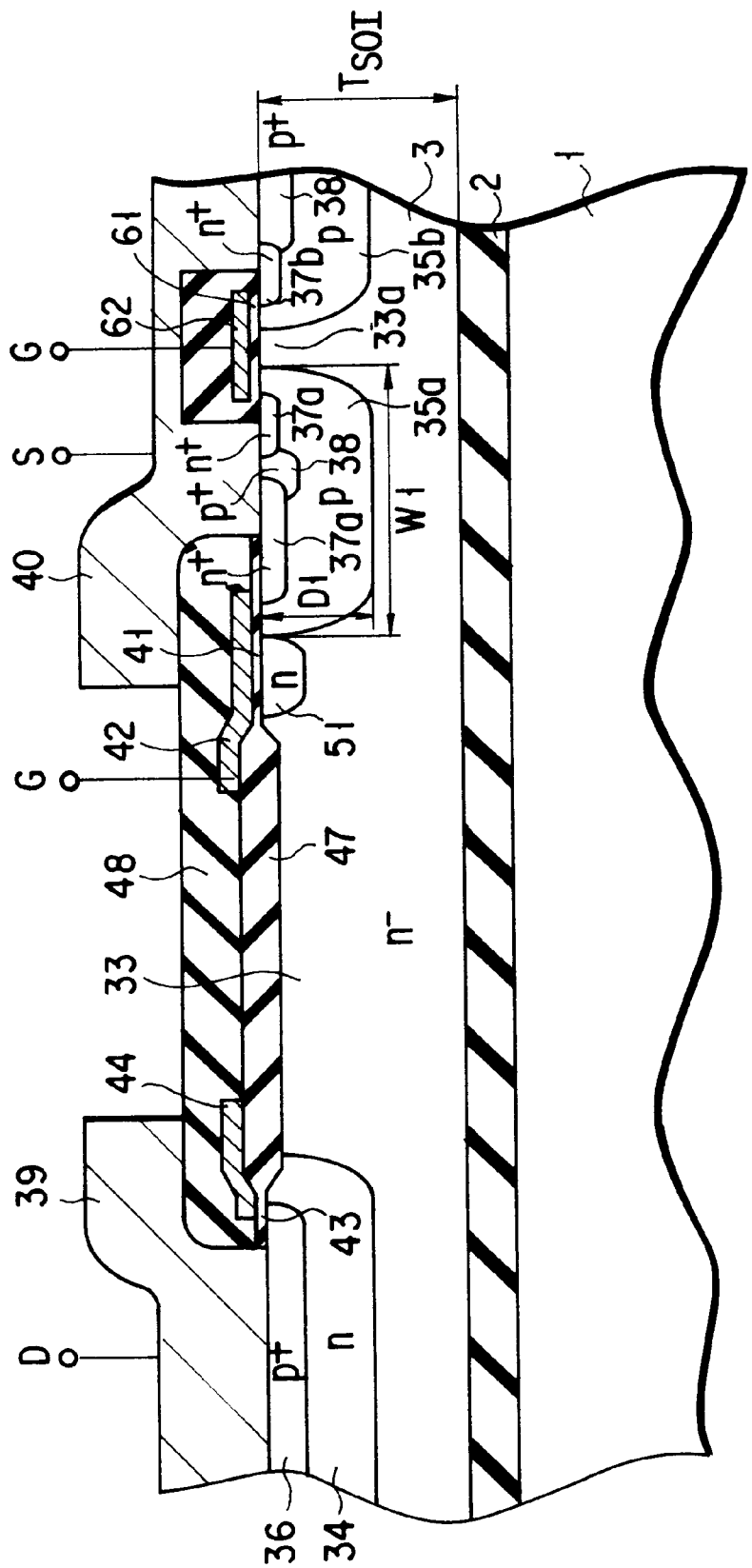
FIG. 25 is a cross-sectional view schematically showing a lateral IGBT according to still another embodiment of the present invention.

FIG. 25 is a cross-sectional view schematically showing a lateral IGBT according to still another embodiment of the present invention.

In this embodiment, an n-type relay layer 51 is arranged not to overlap with a p-type base layer 35, but to be only in contact therewith. In this case, the channel length Lch defined by the distance between the n⁺-type source layer 37 and the n-type relay layer 51 cannot be shorter than the original channel length Lo defined by the distance between the n⁺-type source layer 37 and the n⁻-type drift layer 33. However, since the n-type relay layer 51 is formed in the n⁻-type drift layer 33 and lowers the resistivity at that portion, an effect of decreasing the ON resistance was obtained. Accordingly, the n-type relay layer 51 may be arranged slightly separate from the p-type base layer 35, so long as the n-type relay layer 51 has a facing portion which faces the n⁺-type source layer 37 through the p-type base layer 35 under the main gate electrode 42.

In this embodiment, the p-type base layer 35 has first and second portions 35a and 35b arranged to sandwich therebetween an intervening portion 33a which is part of the n⁻-type drift layer 33. The n⁺-type source layer 37 has first and second portions 37a and 37b formed in the surfaces of the first and second portions 35a and 35b of the p-type base layer 35, respectively.

The first and second portions 35a and 35b of the p-type base layer 35 are arranged separate from each other along a direction which is prevailing in lines connecting the n⁺-type source layer 37 and the p⁺-type drain layer 36. This separating direction can be considered as a prevailing direction along which electrons drift between the source and drain, i.e., drifting direction.

A sub-gate electrode 62 is arranged, through a gate oxide film 61, over the surface between the first and second portions 37a and 37b of the source layer 37. In other words, the sub-gate electrode 62 faces, through the gate oxide film 61, a surface of the first portion 35a of the base layer 35 which is interposed between the first portion 37a of the source layer 37 and the intervening portion 33a of the drift layer 33, and also faces, through the gate oxide film 61, a surface of the second portion 35b of the base layer 35 which is interposed between the second portion 37b of the source layer 37 and the intervening portion 33a of the drift layer 33. The main gate electrode 42 and sub-gate electrode 62 may be formed integral, or may be formed independent of each other with, e.g., an Al wiring layer electrically connecting them.

In this embodiment, three n-type MOSFETs are constituted so as to form three n-type channels. As a result, the channel width is effectively increased thereby lowering the resistance of the channels as a whole. It follows that the current density per unit surface area is increased, thereby allowing a chip size to be compact.

The width W1 of the first portion 35a of the base layer 35 should be small for increasing the current density. Specifically, the width W1 is set preferably at 10 μm or less. Where the width is set at 6 μm or less, the current density becomes about twice as large. The depth D1 of the first portion 35a of the base layer 35 should be small. The depth D1 is set preferably at 6 μm or less, and more preferably at 4 μm or less. As the thickness $T_{SOI}$ of the n⁻-type drift layer 33 grows larger, electrons from a channel more distant from the drain are caused to be injected more easily, thereby enhancing the effects of the present invention. The thickness $T_{SOI}$ is set preferably at 7 μm or more, and more preferably at 10 μm or more. By doing so, the effects of arranging a plurality of channels are further enhanced. As described above, the n-type relay layer 51 may be extended to overlap with the p-type base layer 35.

Figure 26:
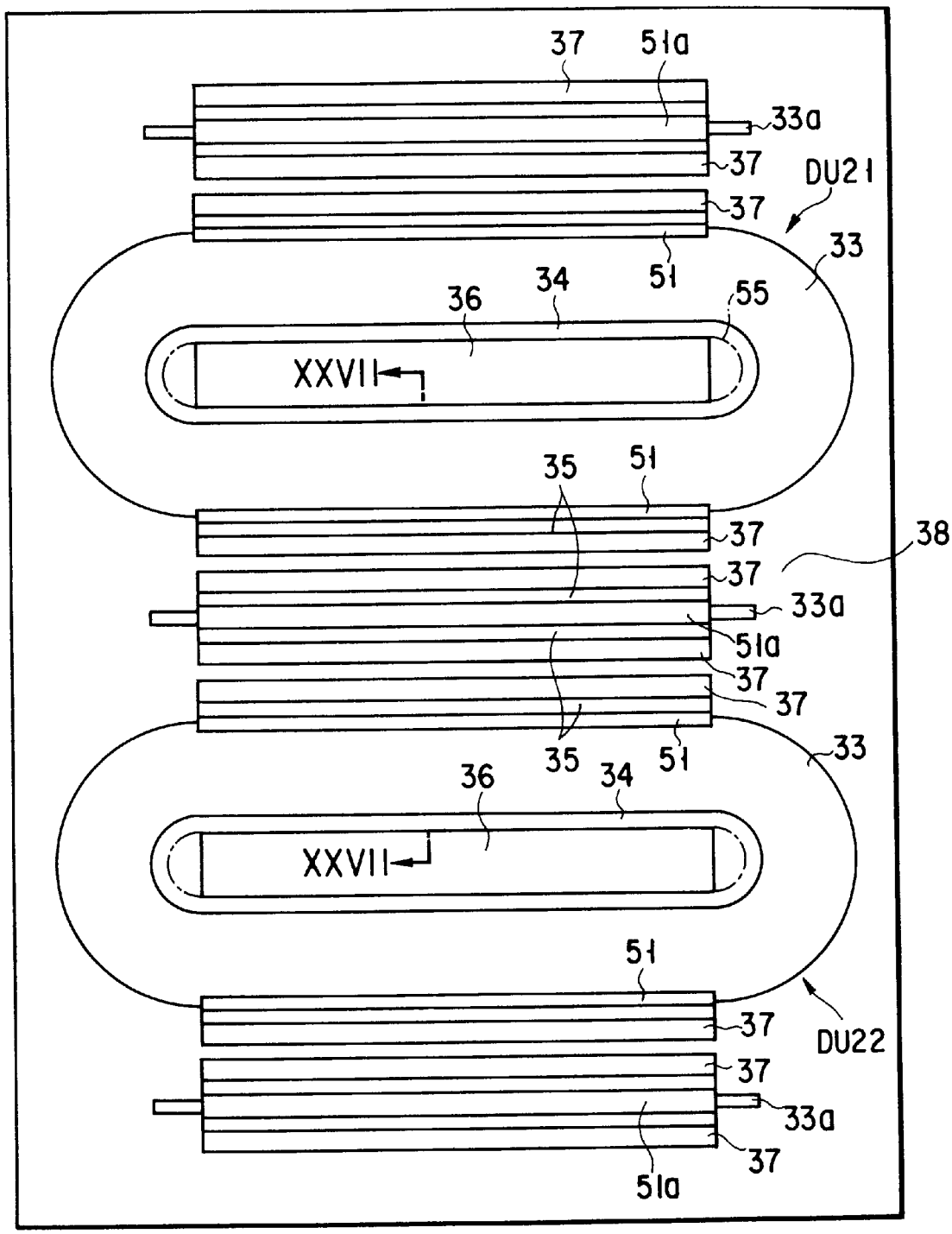
FIG. 26 is a plan view schematically showing a lateral IGBT according to still another embodiment of the present invention.
Figure 27:
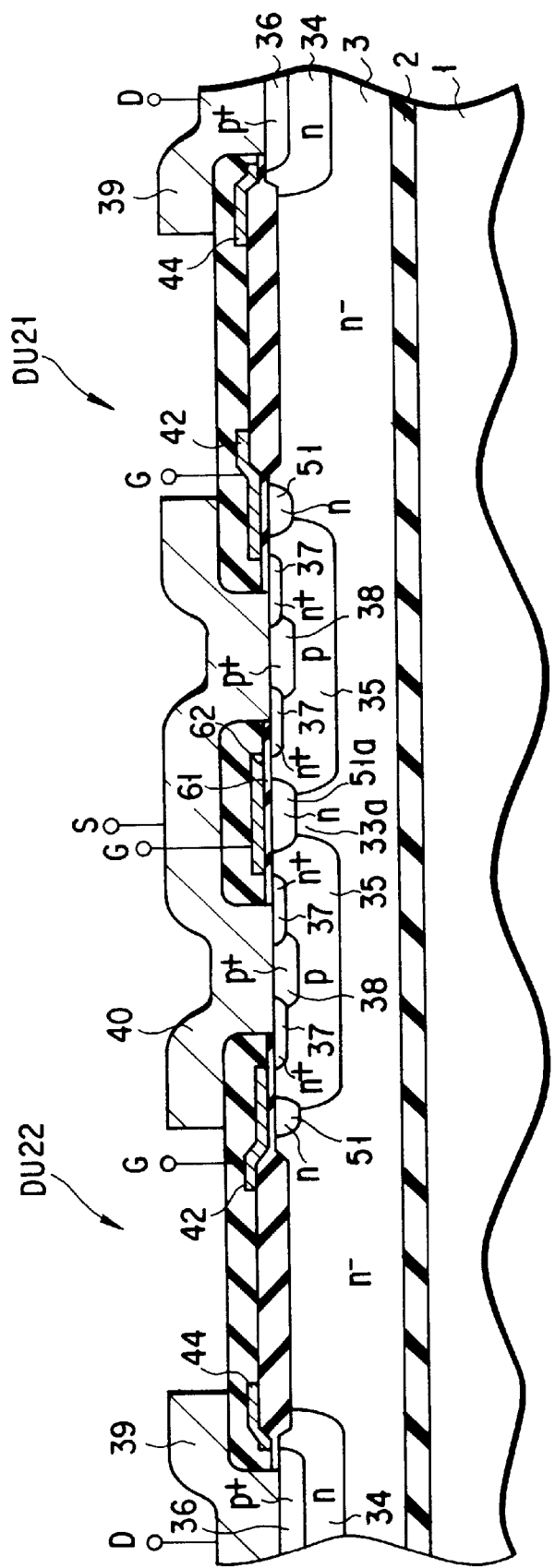
FIG. 27 is a cross-sectional view schematically showing the lateral IGBT along line XXVII—XXVII in FIG. 26.

FIG. 26 is a plan view schematically showing a lateral IGBT according to still another embodiment of the present invention, and FIG. 27 is a cross-sectional view schematically showing the lateral IGBT along line XXVII—XXVII in FIG. 26.

In this embodiment, two device units DU21 and DU22 are arranged side by side. As in the embodiment shown in FIG. 24, each of the device units DU21 and DU22 has an arrangement such that a p-type base layer 35 and a p⁺-type contact layer 38 concentrically, completely surround a p⁺-type drain layer 36. However, unlike the embodiment shown in FIG. 24, the device units DU21 and DU22 commonly own two MOSFET utilizing an intervening portion 33a, which is part of an n⁻-type drift layer 33, and a sub-gate electrode 62. In other words, as in the embodiment shown in FIG. 25, each of the device units DU21 and DU22 essentially has three n-type MOSFETs. In this case, the third n-type MOSFET of the device unit DU21, which is most distant from the drain layer 36 of the device unit DU21, works as the second n-type MOSFET of the adjacent device unit DU22.

Further, in addition to an n-type relay layer 51 under a main gate electrode 42, an n-type relay layer 51a is formed in the surface of the intervening portion 33a to face the n⁺-type source layer 37 through the p-type base layer 35 under the sub-gate electrode 62. The n-type relay layer 51a extends from the intervening portion 33a into the p-type base layer 35, so that it has a facing portion formed in the surface of the p-type base layer 35 to face the n⁺-type source layer 37.

With this arrangement, the channel length is shortened so that an effect of decreasing the ON resistance is obtained, in all the MOSFETs formed under the main gate electrodes 42 and sub-gate electrodes 62.

Note that the left and right ends of the drain layer 36 may be formed semi-circular along an n-type buffer layer, as indicated with one-dot chain lines 55 in FIG. 26, where current concentration at the ends of the device units is not critical.

As in this embodiment shown in FIG. 26, an n-type relay layer 51a may be formed in the surface of the intervening portion 33a also in the embodiment shown in FIG. 25.

FIGS. 28A to 30B are cross-sectional views schematically showing steps of a method of fabricating the IGBT according to the embodiment shown in FIGS. 21 to 23, along with MOSFETs having a low breakdown-voltage in a peripheral circuit. This method can be applied to the IGBTs according to the other embodiments shown in FIGS. 18 to 20 and FIGS. 24 to 27, essentially as it is, by modifying that part of the method which corresponds to the structurally modified part.

Figure 28A:
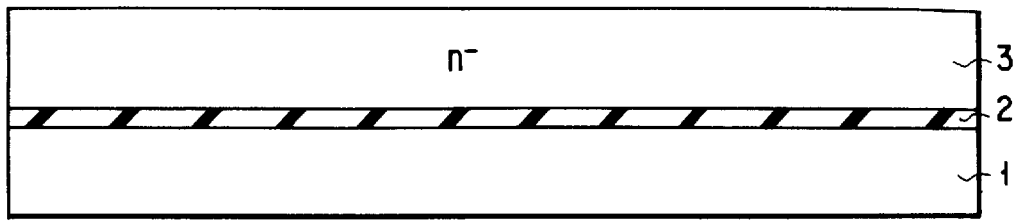
FIGS. 28A to 28C, 29A to 29C and 30A and 30B are cross-sectional views schematically showing steps of a method of fabricating the IGBT according to the embodiment shown in FIGS. 21 to 23, along with MOSFETs having a low breakdown-voltage in a peripheral circuit.

At first, the SOI substrate having the silicon substrate 1, silicon oxide film 2, and n-type silicon layer 3 is formed by means of a direct bonding method. The thickness of the n⁻-type silicon layer 3 is set at, e.g., about 10 μm (FIG. 28A). Note that the surface of the n⁻-type silicon layer 3 is provided with a thin oxide film (not shown) having a thickness of from about several nanometers to several tens nanometers, during the following steps shown in FIGS. 28B to 29B.

Figure 28B:
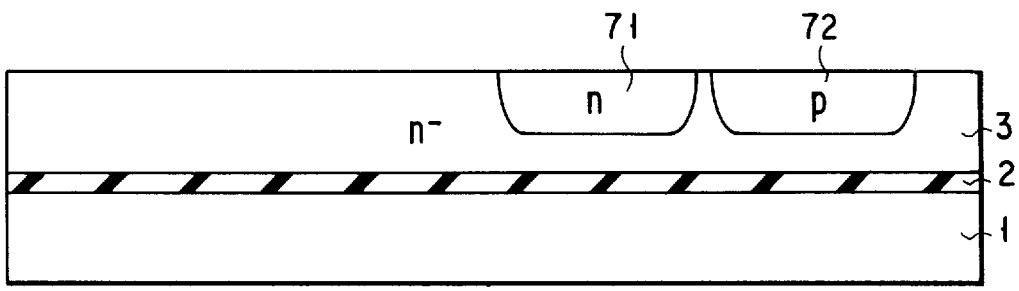

Then, a n-type well layer 71 and a p-type well layer 72 are formed in the surface of the n⁻-type silicon layer 3, for fabricating a PMOSFET and an NMOSFET, respectively, both of a low breakdown voltage. The formation steps for the n-type well layer 71 and the p-type well layer 72 are independently performed, each using processes, such as formation of a resist mask pattern by means of photo-lithography, and ion-implantation and thermal diffusion of an impurity (FIG. 28B).

Then, the n-type buffer layer 34 is formed in the surface of the n⁻-type silicon layer 3. The formation step of the n-type buffer layer 34 is performed, using processes, such as formation of a resist mask pattern by means of photo-lithography, and ion-implantation and thermal diffusion of an impurity.

Figure 28C:
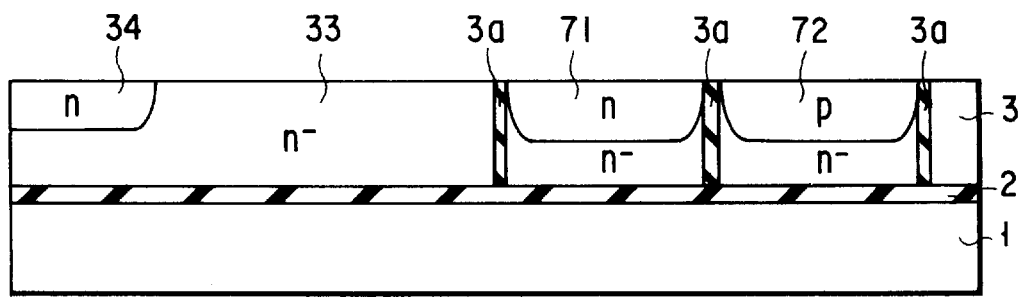

Then, trenches are formed in the n⁻-type silicon layer 3 to correspond to device isolation regions and to reach the silicon oxide film 2, and the embedded insulating films 3a of SiO₂ (or polysilicon) are formed in the trenches by means of LPCVD. With this step, a power device (IGBT) region, i.e., the n⁻-type drift layer 33, is isolated from a low-breakdown-voltage-device region, while the n-type well layer 71 and the p-type well layer 72 are isolated from each other in the low-breakdown-voltage-device region (FIG. 28C).

Figure 29A:
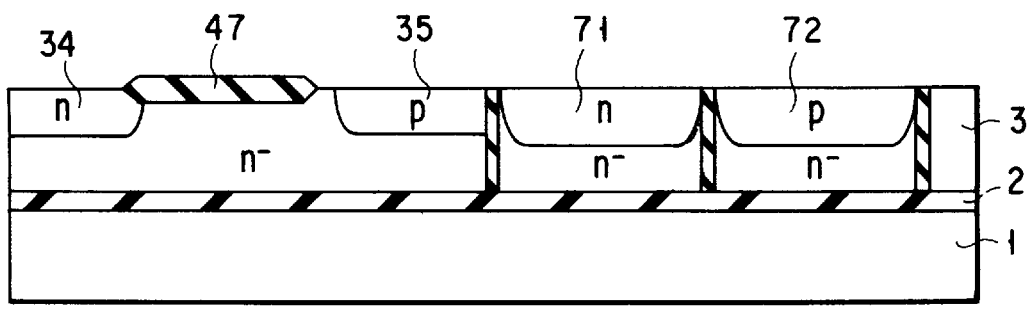

Then, the p-type base layer 35 is formed in the surface of the n⁻-type drift layer 33. The formation step of the p-type base layer 35 is performed, using processes, such as formation of a resist mask pattern by means of photo-lithography, and ion-implantation and thermal diffusion of an impurity. Then, the thick oxide film 47 having a thickness of about 1 μm is selectively formed in the IGBT region by means of an LOCOS process (FIG. 29A). Note that a thermal treatment for the LOCOS process may be used for the thermal diffusion of the impurity in the p-type base layer 35.

Specifically, in the LOCOS process, the entire exposed surface of the n⁻-type drift layer 3 is oxidized to form a thin oxide film having a thickness of about 0.1 μm. Further, a nitride film is formed on the thin oxide film. Then, the nitride film is selectively removed to correspond to the thick oxide film 47 to be formed. Then, the overall surface is subjected to oxidation, so that the thick oxide film 47 having a thickness of about 1 μm is formed at regions where the nitride film has been removed.

Then, the remaining nitride film is removed, and an n-type diffusion layer 73 and a p-type diffusion layer 74 are formed in the n-type well layer 71 and the p-type well layer 72, respectively, for setting the threshold voltages of the low breakdown-voltage MOSFETS, i.e., for providing channel regions. The formation steps for the n-type diffusion layer 73 and the p-type diffusion layer 74 are independently performed, each using processes, such as formation of a resist mask pattern by means of photo-lithography, and ion-implantation and thermal diffusion of an impurity.

Figure 29B:
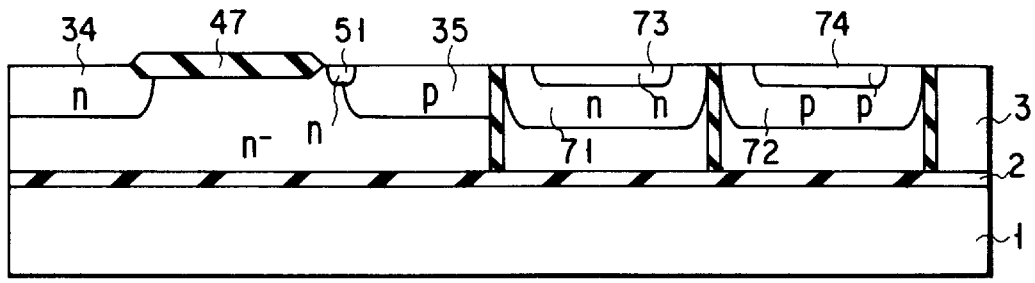

At the same time as the n-type diffusion layer 73 is formed in the PMOSFET region, the n-type relay layer 51 is formed in the surface of the IGBT region to extend from the n⁻-type drift layer 33 to the p-type base layer 35. In other words, the formation step of the n-type relay layer 51 is performed, using processes, such as formation of a resist mask pattern by means of photo-lithography, and ion-implantation (at a dose of about $5 \times 10^{12}$ cm$^{-2}$) and thermal diffusion of an impurity, for forming the n-type diffusion layer 73 (FIG. 29B). Where the n-type relay layer 51a is also arranged under the sub-gate electrode 62, as in the embodiment shown in FIG. 27, the formation step of the n-type relay layer 51a is performed simultaneously with the formation step of the n-type relay layer 51.

Then, the thin oxide film is removed, and the gate oxide films 41 and 43 are formed in the IGBT region, while gate oxide films 75 and 76 are formed in the low-breakdown-voltage-MOSFET region.

Figure 29C:
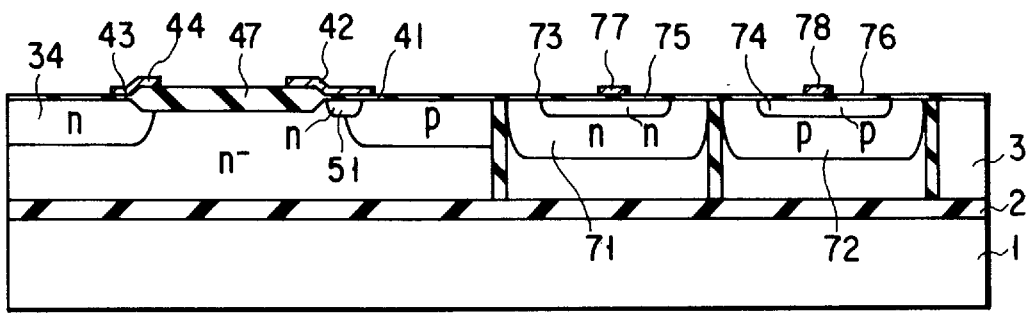

Then, a polysilicon film is formed all over and patterned to form the main gate electrode 42 and the field plate 44 in the IGBT region, and gate electrodes 77 and 78 in the low-breakdown-voltage-MOSFET region (FIG. 29C).

Figure 30A:
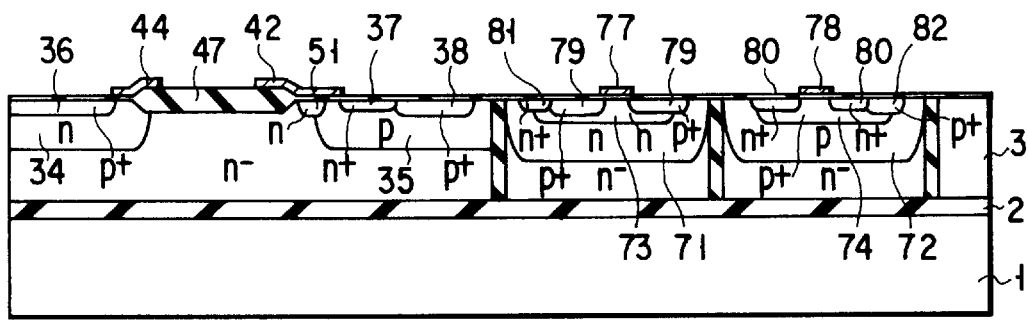

Then, the p⁺-type drain layer 36 and the p⁺-type contact layer 38 in the IGBT region, p⁺-type source/drain layers 79 in the PMOSFET region, and a p⁺-type diffusion layer 82 in the NMOSFET region are simultaneously formed. Similarly, the n⁺-type source layer 37 in the IGBT region, an n⁺-type diffusion layer 81 in the PMOSFET region, and n⁺-type source/drain layers 80 in the NMOSFET region are simultaneously formed. The formation steps for the p⁺-type layers and the n⁺-type layers are independently performed, each using processes, such as formation of a resist mask pattern by means of photo-lithography, and ion-implantation and thermal diffusion of an impurity. The thermal treatments for the p⁺-type layers and the n⁺-type layers may be simultaneously performed. In these formation steps, the formed electrodes 42, 44, 77, and 78, and the oxide film 47 are also used as masks (FIG. 30A).

Figure 30B:
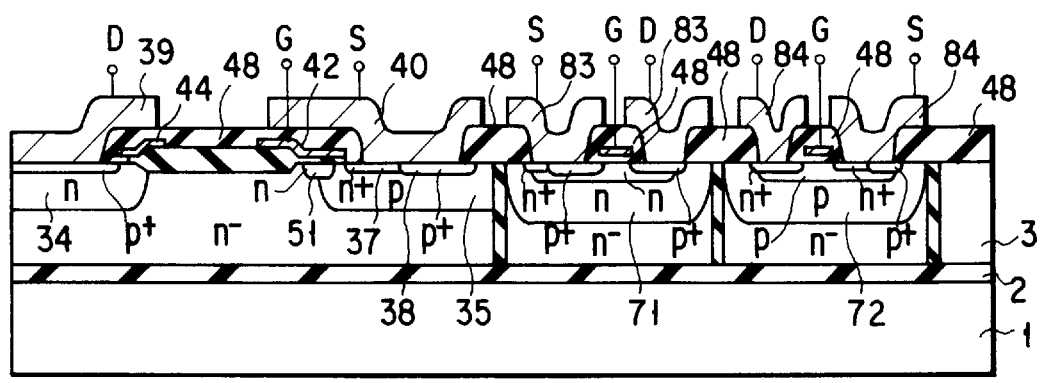

Then, the oxide film 48 is formed all over and patterned along with other insulating films, so that the contact holes are formed. Finally, the drain and source electrodes 39 and 40 in the IGBT region, source/drain electrodes 83 in the PMOSFET region, and source/drain electrodes 84 in the NMOSFET region are formed (FIG. 30B).

The order of the steps of the above described method can be changed, if necessary. For example, in order to form the p-type base layer 35 deeper, ion-implantation for the p-type base layer 35 is performed preferably before the trenches of the device-isolation regions are formed. The ion-implantation for the p-type base layer 35 may be performed after the main gate electrode 42 is formed, so that the p-type base layer 35 is formed by means of self-alignment. The trenches of the device-isolation regions may be formed first. The LOCOS process may be performed first, so that stress to be caused at the top and bottom portions of the trenches is decreased.

Figure 31:
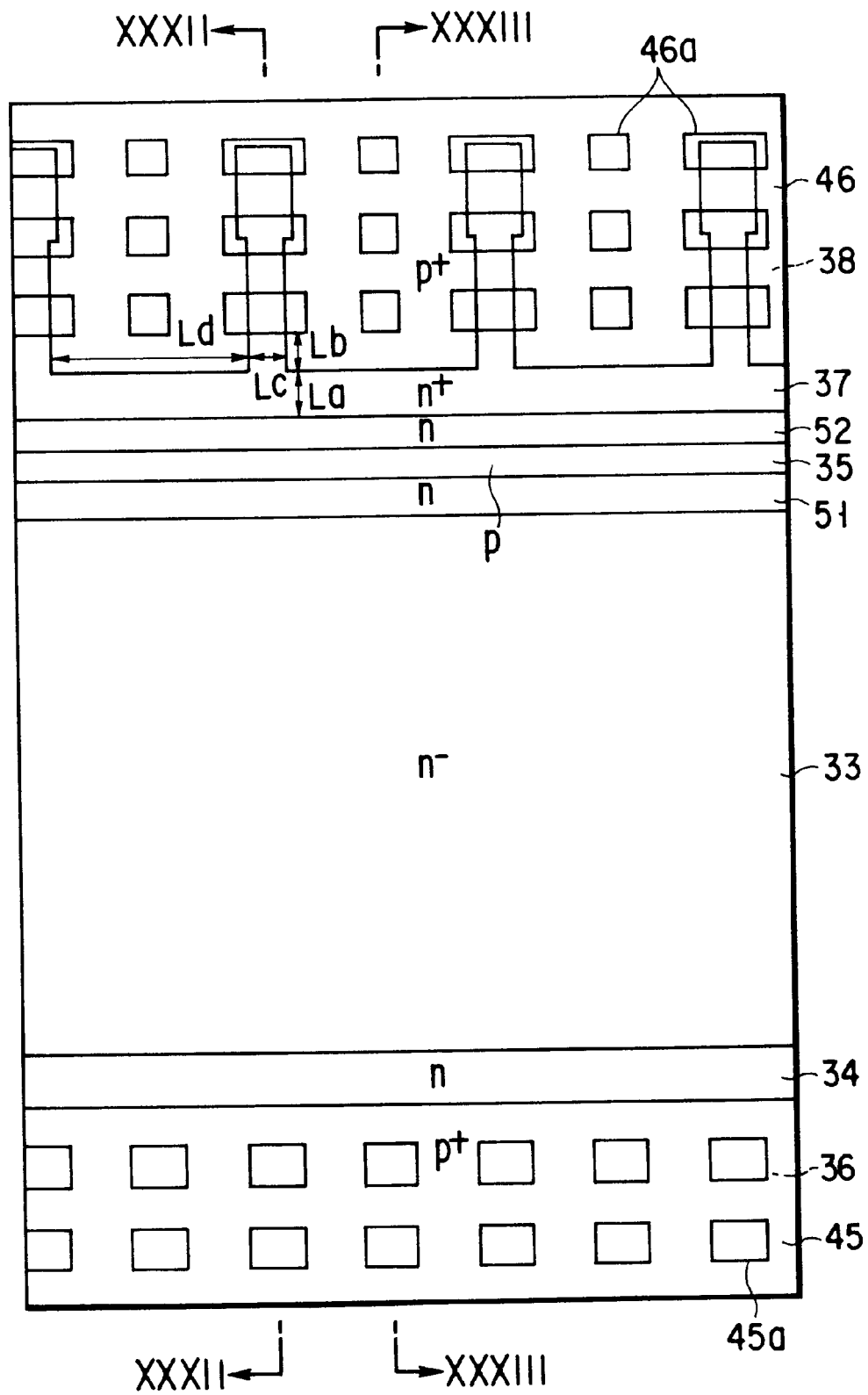
FIG. 31 is a plan view schematically showing a lateral IGBT according to still another embodiment of the present invention.
Figure 32:
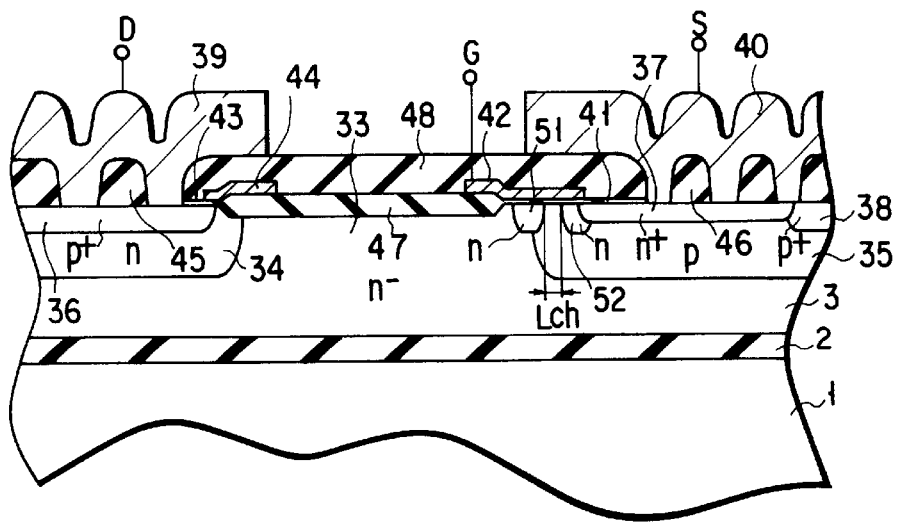
FIG. 32 is a cross-sectional view schematically showing the lateral IGBT along line XXXII—XXXII in FIG. 31.
Figure 33:
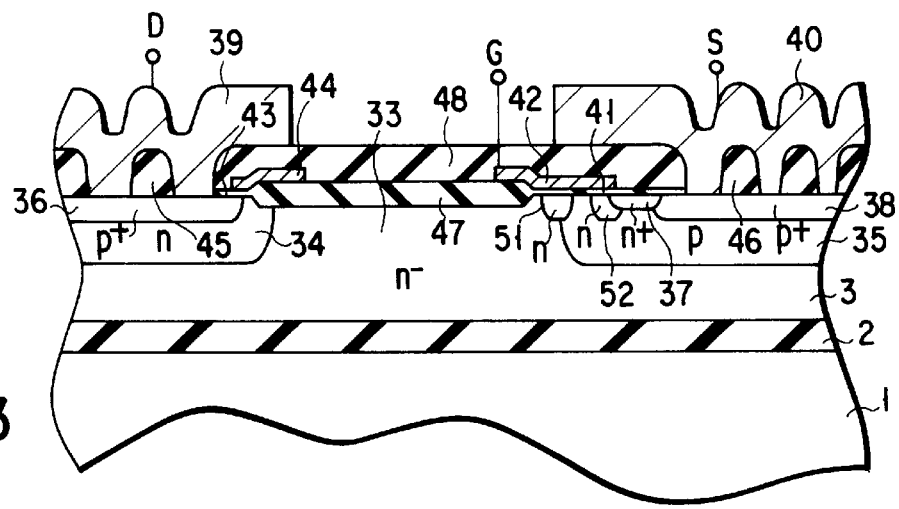
FIG. 33 is a cross-sectional view schematically showing the lateral IGBT along line XXXIII—XXXIII in FIG. 31.

FIG. 31 is a plan view schematically showing a lateral IGBT according to still another embodiment of the present invention, and FIGS. 32 and 33 are cross-sectional views schematically showing the lateral IGBT along line XXXII—XXXII and line XXXIII—XXXIII in FIG. 31, respectively.

This embodiment has a structure the same as that of the embodiment shown in FIGS. 18 to 20, except that an n-type diffusion layer 52 is added to face an n-type relay layer 51 though a p-type base layer 35 under a main gate electrode 42. The n-type diffusion layer 52 is formed in the surface of the p-type base layer 35 to be connected to the n⁺-type source layer 37. The formation step of the n-type relay layer 52 is performed, using processes, such as formation of a resist mask pattern by means of photo-lithography, and ion-implantation (at a dose of about $5 \times 10^{12}$ cm$^{-2}$) and thermal diffusion of an impurity, for forming the n-type relay layer 51 and the n-type diffusion layer 73 in the step shown in FIG. 29B.

According to this embodiment, the channel length Lch under the main gate electrode 42 is shortened, so that an effect of decreasing the ON resistance is obtained, as in the embodiment shown in FIGS. 18 to 20. Further, the n-type relay layer 51 and the n-type diffusion layer 52 are simultaneously formed, using the same lithography, and thus the channel length Lch can be accurately controlled by a width between openings of a mask.

Since the dose of the ion-implantation for forming the n-type diffusion layer 73 is low in the step shown in FIG. 29B, the n-type diffusion layer 52 to be formed in the surface of the p-type base layer 35 may not be fully n-type. Even in such a case, since the p-type concentration in the p-type base layer 35 of the IGBT is substantially lowered, the channel resistance is decreased to attain an effect of increasing the ON current.

Figure 35:
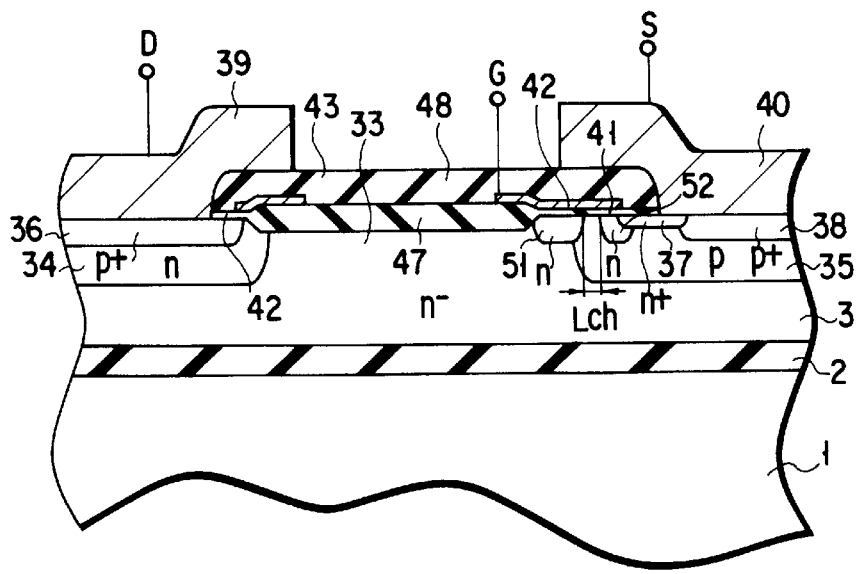
FIG. 35 is a cross-sectional view schematically showing the lateral IGBT along line XXXV—XXXV in FIG. 34.
Figure 34:
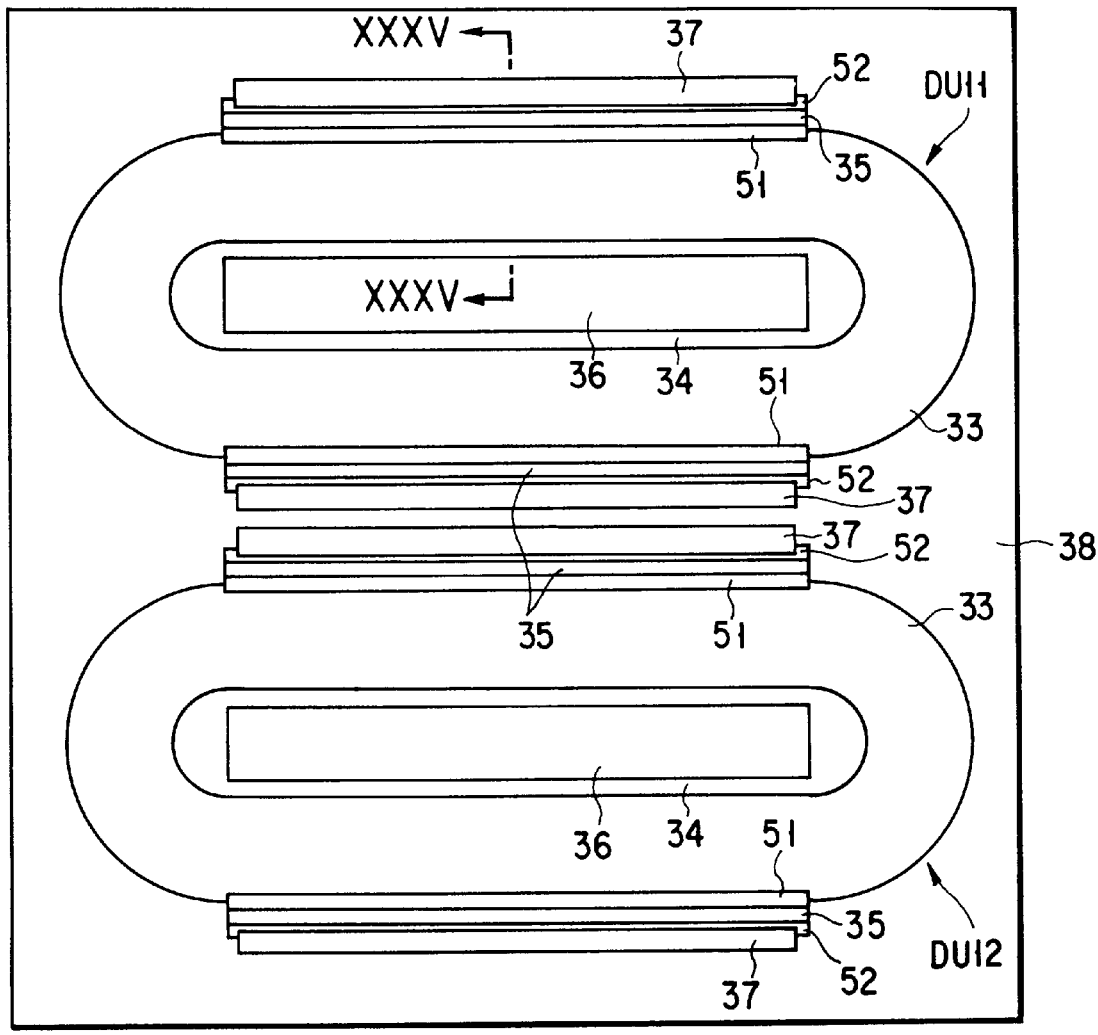
FIG. 34 is a plan view schematically showing a lateral IGBT according to still another embodiment of the present invention.

FIG. 34 is a plan view schematically showing a lateral IGBT according to still another embodiment of the present invention, and FIG. 35 is a cross-sectional view schematically showing the lateral IGBT along line XXXV—XXXV in FIG. 34.

This embodiment has a structure in which an n-type diffusion layer 52 is further formed to face an n-type relay layer 51 though a p-type base layer 35 under a main gate electrode 42, in the structure of the embodiment shown in FIG. 24.

Figure 36:
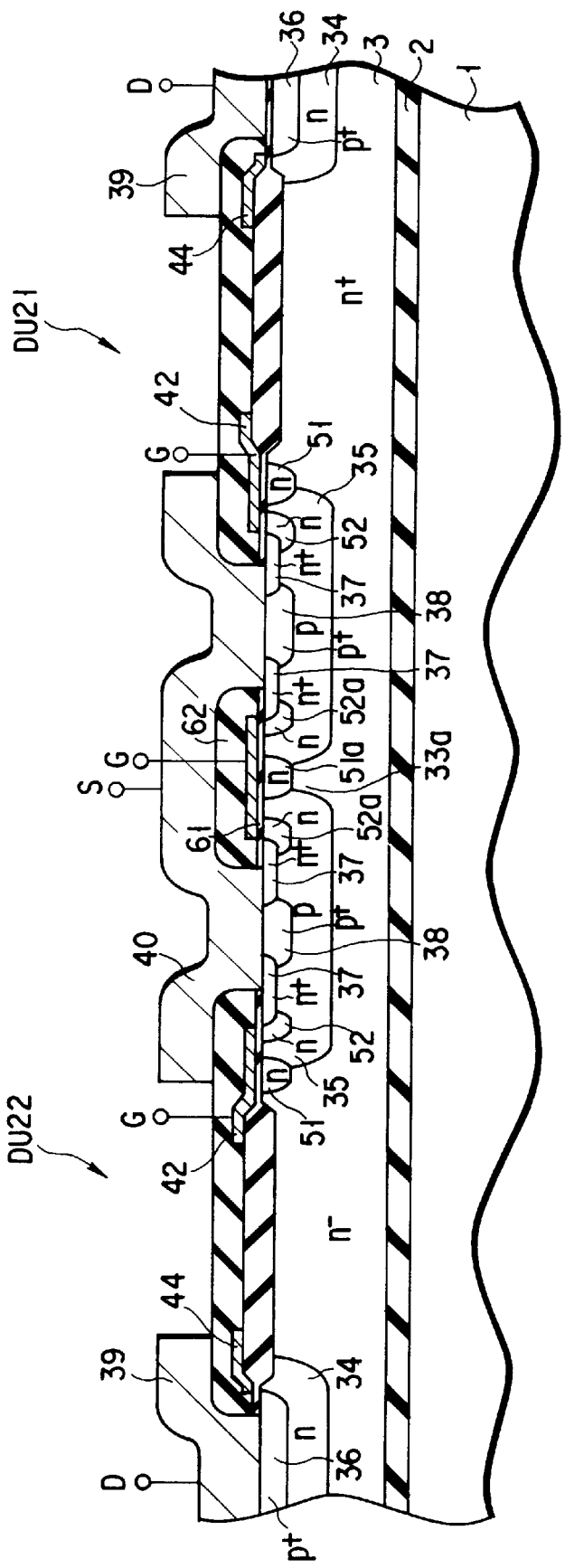
FIG. 36 is a cross-sectional view schematically showing a lateral IGBT according to still another embodiment of the present invention.

FIG. 36 is a cross-sectional view schematically showing a lateral IGBT according to still another embodiment of the present invention;

This embodiment has a structure in which an n-type diffusion layer 52 is further formed to face an n-type relay layer 51 through a p-type base layer 35 under a main gate electrode 42, and an n-type diffusion layer 52a is further formed to face an n-type relay layer 51a through the p-type base layer 35 under a sub-gate electrode 62, in the structure of the embodiment shown in FIGS. 26 and 27. The formation step of the n-type diffusion layers 52 and 52a is performed, using processes, such as formation of a resist mask pattern by means of photo-lithography, and ion-implantation (at a dose of about $5 \times 10^{12}$ cm$^{-2}$) and thermal diffusion of an impurity, for forming the n-type relay layers 51 and 51a and the n-type diffusion layer 73 in the step shown in FIG. 29B.

Comparative experiments were conducted on IGBTs according to the embodiment shown in FIGS. 18 to 20, in terms of ON current.

Present examples E1 to E4 according to the embodiment shown in FIGS. 18 to 20 were formed, such that parameters La to Ld in the pattern of the source side shown in FIG. 18 were set at values as shown in the following Table 1.

Figure 37A:
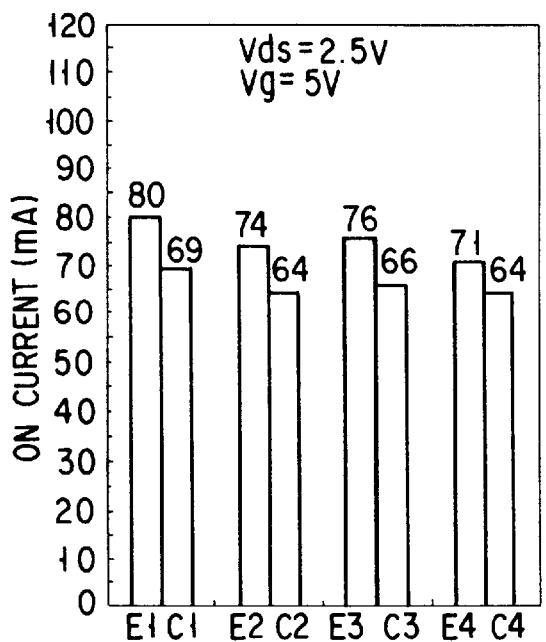
FIGS. 37A and 37B are graphs showing results of comparative experiments conducted on IGBTs according to the embodiment shown in FIGS. 18 to 20, in terms of ON current.

Comparative examples C1 to C4 were formed with conditions the same as those of the present samples E1 to E4, respectively, except that they were not provided with any n-type relay layer 51. In these experiments, the depth of the n-type buffer layer 34 was set at 1.6 μm, the channel width under the main electrode 42 at 800 μm, and the drift length between the p-type base layer 35 and the n-type buffer layer 34 at 55 μm. FIG. 37A shows experimental results where a source-drain voltage Vds of 2.5V and a gate voltage Vg of 5V were used, while FIG. 37B shows experimental results where a source-drain voltage Vds of 3.0V and a gate voltage Vg of 5V were used.

Figure 37B:
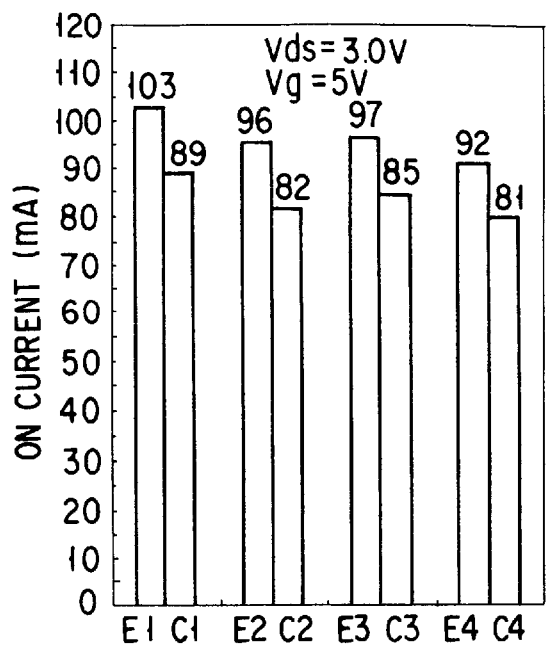

As shown in FIGS. 37A and 37B, the present examples according to the embodiment shown in FIGS. 18 to 20 gave ON currents larger than those of the comparative examples by from 10% to 20%, in all the conditions. In other words, an advantage of the present invention obtained by arranging the n-type relay layer 51 was confirmed.

TABLE 1

| Sample No. | Parameter (μm) | | | |
| --- | --- | --- | --- | --- |
| | La | Lb | Lc | Ld |
| E1, C1 | 2 | 1 | 2 | 5 |
| E2, C2 | 2 | 1 | 1 | 10 |
| E3, C3 | 1 | 2 | 2 | 10 |
| E4, C4 | 1 | 2 | 1 | 10 |

Similarly, comparative experiments were conducted on IGBTs according to the embodiments shown in FIGS. 18 to 20 and FIGS. 31 to 33, in terms of ON current.

Figure 38A:
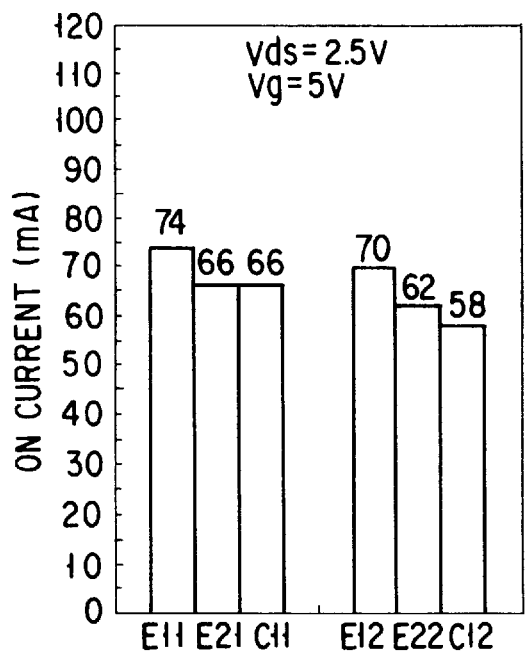
FIGS. 38A and 38B are graphs showing results of comparative experiments conducted on IGBTs according to the embodiments shown in FIGS. 18 to 20 and FIGS. 31 to 33, in terms of ON current.

Present examples E11 and E12 according to the embodiment shown in FIGS. 18 to 20 and present examples E21 and E22 according to the embodiment shown in FIGS. 31 to 33 were formed, such that parameters La to Ld in the patterns of the source sides shown in FIGS. 18 and 31 were set at values as shown in the following Table 2. Comparative examples C11 and C12 were formed with conditions the same as those of the present samples E11 (or E21) and E12 (or E22), respectively, except that they were not provided with any n-type relay layer 51 or n-type diffusion layer 52. In these experiments, the depth of the n-type buffer layer 34 was set at 5.5 μm, the channel width under the main electrode 42 at 800 μm, and the drift length between the p-type base layer 35 and the n-type buffer layer 34 at 55 μm. FIG. 38A shows experimental results where a source-drain voltage Vds of 2.5V and a gate voltage Vg of 5V were used, while FIG. 38B shows experimental results where a source-drain voltage Vds of 3.0V and a gate voltage Vg of 5V were used.

Figure 38B:
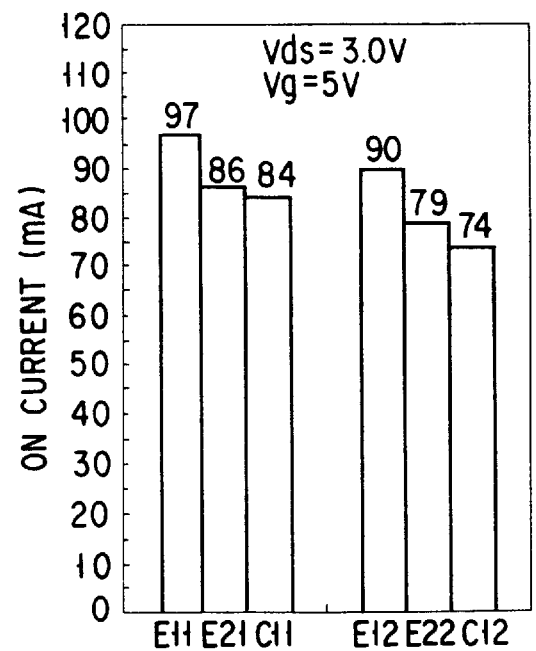

As shown in FIGS. 38A and 38B, the present examples according to the embodiment shown in FIGS. 31 to 33 gave ON currents larger than those of the comparative examples. In other words, an advantage of the present invention obtained by arranging the n-type relay layer 51 and the n-type diffusion layer 52 was confirmed. Further, the present examples according to the embodiment shown in FIGS. 18 to 20 gave ON currents larger than those of the present examples according to the embodiment shown in FIGS. 31 to 33. This is due to the fact that the channel length Lch of the embodiment shown in FIGS. 18 to 20 is defined by the distance between the n-type relay layer 51 and the n$^+$-type source layer 37, while the channel length Lch of the embodiment shown in FIGS. 31 to 33 is defined by the distance between the n-type relay layer 51 and the n-type diffusion layer 52. In other words, upon the same channel length, the embodiment shown in FIGS. 18 to 20 gives an ON current larger than that of the embodiment shown in FIGS. 31 to 33.

TABLE 2

| Sample No. | Parameter (μm) | | | |
| --- | --- | --- | --- | --- |
| | La | Lb | Lc | Ld |
| E11, E12, C11 | 2 | 1 | 2 | 5 |
| E12, E22, C12 | 2 | 1 | 1 | 10 |

Although the above described embodiments are exemplified by n-channel IGBTs, the present invention can be similarly applied to p-channel IGBTs. In this case, the formation step of a p-type relay layer for shortening the channel length is performed, using processes, such as formation of a resist mask pattern by means of photolithography, and ion-implantation and thermal diffusion of an impurity, for forming a p-type diffusion layer which provides the channel region of a low breakdown-voltage NMOSFET in the peripheral circuit. Further, although a silicon film is used as an SOI semiconductor film in the above described embodiments, other semiconductor films may be used instead. Furthermore, the features of the embodiments may be arbitrarily combined.

As described above, according to the present invention, the n-type relay layer 51 is formed in the surface of the n$^-$-type drift layer 33 to face the n$^+$-type source layer 37 through the p-type base layer 35 under the main gate electrode 42. With this arrangement, the channel length Lch becomes shorter than that of a conventional structure, so that the channel resistance is decreased to increase current density in its ON state.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A semiconductor device having a lateral IGBT, said IGBT comprising:

a drift layer of a first conductivity type formed by using a semiconductor active layer of a high resistivity;

a drain layer of a second conductivity type formed in a common surface of said drift layer;

a base layer of the second conductivity type formed in said common surface of said drift layer;

a source layer of the first conductivity type formed in a surface of said base layer;

a drain electrode arranged in contact with said drain layer;

a source electrode arranged in contact with said source and base layers; and a main gate electrode facing, through a gate insulating film, a surface of said base layer which is interposed between said source layer and said drift layer, and is located on a side facing said drain layer, wherein a relay layer of the first conductivity type having a resistivity lower than that of said drift layer is formed in said common surface of said drift layer to have a facing portion which faces said source layer through said base layer under said main gate electrode, and said relay layer has a surface concentration of an impurity of the first conductivity type which falls within a range of from $2\times10^{16}$ cm$^{-3}$ to $2\times10^{17}$ cm$^{-3}$.

2. The device according to claim 1, wherein said facing portion of said relay layer extends into said base layer.

3. The device according to claim 1, wherein said source and base layers have portions alternately in contact with said source electrode.

4. The device according to claim 1, wherein said source layer resembles a comb in shape and said source layer is in contact with said source electrode through teeth of said comb.

5. The device according to claim 1, further comprising a CMOSFET which has a layer of the first conductivity type formed in the same step as said relay layer, and arranged to induce a channel of the second conductivity type in its surface.

6. The device according to claim 1, wherein said drift layer is arranged on an insulating film.

7. A semiconductor device having a lateral IGBT, said IGBT comprising:
 a drift layer of a first conductivity type formed by using a semiconductor active layer of a high resistivity;
 a drain layer of a second conductivity type formed in a common surface of said drift layer;
 a base layer of the second conductivity type formed in said common surface of said drift layer;
 a source layer of the first conductivity type formed in a surface of said base layer;
 a drain electrode arranged in contact with said drain layer;
 a source electrode arranged in contact with said source and base layers; and
 a main gate electrode facing, through a gate insulating film, a surface of said base layer which is interposed between said source layer and said drift layer, and is located on a side facing said drain layer,
 wherein said base layer comprises first and second portions facing each other through an intervening portion which is part of said drift layer,
 said source layer comprises first and second portions respectively formed in surfaces of said first and second portions of said base layer,
 a sub-gate electrode is arranged to face, through a gate insulating film, a surface of said first portion of said base layer which is interposed between said first portion of said source layer and said intervening portion, and a surface of said second portion of said base layer which is interposed between said second portion of said source layer and said intervening portion, and
 further wherein a relay layer of the first conductivity type having a resistivity lower than that of said drift layer is formed in said common surface of said drift layer to have a facing portion which faces said source layer through said base layer under said main gate electrode.

8. The device according to claim 7, wherein another relay layer of the first conductivity type having a resistivity lower than that of said drift layer is formed in a surface of said intervening portion.

9. The device according to claim 7, wherein said relay layer has a surface concentration of an impurity of the first conductivity type which falls within a range of from $2\times10^{16}$ cm$^{-3}$ to $2\times10^{17}$ cm$^{-3}$.

10. The device according to claim 7, wherein said facing portion of said relay layer extends into said base layer.

11. The device according to claim 7, wherein said source and base layers have portions alternately in contact with said source electrode.

12. The device according to claim 7, further comprising a CMOSFET which has a layer of the first conductivity type formed in the same step as said relay layer, and arranged to induce a channel of the second conductivity type in its surface.

13. The device according to claim 7, wherein said drift layer is arranged on an insulating film.

14. A semiconductor device having a lateral IGBT, said IGBT comprising:
 a drift layer of a first conductivity type formed by using a semiconductor active layer of a high resistivity;
 a drain layer of a second conductivity type comprising first and second portions formed in a common surface of said drift layer;
 a base layer of the second conductivity type formed in said common surface of said drift layer between said first and second portions of said drain layer;
 a source layer of the first conductivity type formed in a surface of said base layer;
 a drain electrode arranged in contact with said drain layer;
 a source electrode arranged in contact with said source and base layers; and
 a main gate electrode comprising first and second portions facing, through a gate insulating film, surfaces of said base layer which are interposed between said source layer and said drift layer, and are located on sides facing said first and second portions of said drain layer, respectively,
 wherein said base layer comprises first and second portions facing each other through an intervening portion which is part of said drift layer,
 said source layer comprises first and second portions respectively formed in surfaces of said first and second portions of said base layer,
 a sub-gate electrode is arranged to face, through a gate insulating film, a surface of said first portion of said base layer which is interposed between said first portion of said source layer and said intervening portion, and a surface of said second portion of said base layer which is interposed between said second portion of said source layer and said intervening portion, and
 further wherein a relay layer of the first conductivity type having a resistivity lower than that of said drift layer is formed in said common surface of said drift layer to have first and second facing portions which face said first and second portions of said source layer through said first and second portions of said base layer under said first and second portions of said main gate electrode, respectively.

15. The device according to claim 14, wherein said base layer has a surrounding portion surrounding said first and second portions of said drain layer, and said first and second portions of said base layer are part of said surrounding portion of said base layer.

16. The device according to claim 14, wherein another relay layer of the first conductivity type having a resistivity lower than that of said drift layer is formed in a surface of said intervening portion.

17. The device according to claim 14, wherein said relay layer has a surface concentration of an impurity of the first conductivity type which falls within a range of from $2\times10^{16}$ cm$^{-3}$ to $2\times10^{17}$ cm$^{-3}$.

18. The device according to claim 14, wherein said facing portions of said relay layer extend into said base layer.

19. The device according to claim 14, wherein said source and base layers have portions alternately in contact with said source electrode.

20. The device according to claim 14, further comprising a CMOSFET which has a layer of the first conductivity type formed in the same step as said relay layer, and arranged to induce a channel of the second conductivity type in its surface.

21. The device according to claim 14, wherein said drift layer is arranged on an insulating film.

22. A lateral IGBT comprising:
- a drift layer of a first conductivity type formed by using a semiconductor active layer of a high resistance arranged on an insulating film;
- a drain layer of a second conductivity type comprising first and second portions formed in a common surface of said drift layers;
- a base layer of the second conductivity type formed in said common surface of said drift layer between said first and second portions of said drain layer;
- a source layer of the first conductivity type formed in a surface of said base layer;
- a drain electrode arranged in contact with said drain layer;
- a source electrode arranged in contact with said source and base layers; and
- a main gate electrode comprising first and second portions facing, through a gate insulating film, surfaces of said base layer which are interposed between said source layer and said drift layer, and are located on sides facing said first and second portions of said drain layer, respectively;

wherein:
- said base layer comprises first and second portions facing each other through an intervening portion which is part of said drift layer,
- said source layer comprises first and second portions respectively formed in surfaces of said first and second portions of said base layer,
- a sub-gate electrode is arranged to face, through a gate insulating film, a surface of said first portion of said base layer which is interposed between said first portion of said source layer and said intervening portion, and a surface of said second portion of said base layer which is interposed between said second portion of said source layer and said intervening portion, and
- said first portion of said base layer has a surrounding portion surrounding said first portion of said drain layer, and said second portion of said base layer has a surrounding portion surrounding said second portion of said drain layer.

* * * * *